(12) United States Patent
Son et al.

(10) Patent No.: US 11,195,856 B2
(45) Date of Patent: Dec. 7, 2021

(54) SEMICONDUCTOR DEVICE

(71) Applicant: SAMSUNG ELECTRONICS CO., LTD., Suwon-si (KR)

(72) Inventors: Yoon Hwan Son, Seoul (KR); Ji Sung Cheon, Anan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 16/801,278

(22) Filed: Feb. 26, 2020

(65) Prior Publication Data
US 2020/0395378 A1 Dec. 17, 2020

(30) Foreign Application Priority Data
Jun. 14, 2019 (KR) .......................... 10-2019-0070657

(51) Int. Cl.
| | |
|---|---|
| H01L 27/11582 | (2017.01) |
| H01L 27/11524 | (2017.01) |
| H01L 27/11573 | (2017.01) |
| H01L 27/11529 | (2017.01) |
| H01L 27/1157 | (2017.01) |
| H01L 27/11556 | (2017.01) |

(52) U.S. Cl.
CPC .... *H01L 27/11582* (2013.01); *H01L 27/1157* (2013.01); *H01L 27/11524* (2013.01); *H01L 27/11529* (2013.01); *H01L 27/11556* (2013.01); *H01L 27/11573* (2013.01)

(58) Field of Classification Search
CPC ................................................ H01L 27/11582
See application file for complete search history.

(56) References Cited

U.S. PATENT DOCUMENTS

| | | | |
|---|---|---|---|
| 8,916,921 B2 | 12/2014 | Tanaka et al. | |
| 9,515,080 B2 | 12/2016 | Takahashi et al. | |
| 9,698,153 B2 | 7/2017 | Liu et al. | |
| 9,842,854 B2 | 12/2017 | Honda | |
| 9,871,052 B2 | 1/2018 | Lee | |
| 9,960,181 B1 | 5/2018 | Cui et al. | |
| 10,103,169 B1 * | 10/2018 | Ge | H01L 27/11575 |
| 2017/0345843 A1 | 11/2017 | Lee et al. | |
| 2017/0365616 A1 * | 12/2017 | Kang | H01L 21/76877 |

FOREIGN PATENT DOCUMENTS

| | | |
|---|---|---|
| KR | 1263182 B1 | 5/2013 |
| KR | 20150064520 A | 6/2015 |

* cited by examiner

*Primary Examiner* — Christopher A Johnson
(74) *Attorney, Agent, or Firm* — Volentine, Whitt & Francos, PLLC

(57) ABSTRACT

A semiconductor device includes a first substrate in which a first region and a second region are defined, a first stack structure with first gate electrodes displaced and stacked sequentially on the first substrate, a second stack structure with second gate electrodes displaced and stacked sequentially on the first stack structure, a junction layer disposed between the first stack structure and the second stack structure, a first interlayer insulating layer disposed on a side surface of the first stack structure, a second interlayer insulating layer covering the second stack structure, a first channel hole that penetrates through structure(s) and/or layer(s) and a second channel hole that penetrates through structure(s) and/or layer(s). A height of the second portion of the first channel hole in a second direction orthogonal to the first direction is less than a height of the second portion of the second channel hole in the second direction.

19 Claims, 24 Drawing Sheets

SEMICONDUCTOR DEVICE

This application claims the benefit of priority under 35 U.S.C. § 119 to Korean Patent Application No. 10-2019-0070657, filed on Jun. 14, 2019 in the Korean Intellectual Property Office, the disclosure of which is incorporated herein by reference in its entirety.

BACKGROUND

1. Technical Field

The present disclosure relates to a semiconductor device.

2. Description of the Related Art

The integration density of nonvolatile memory devices continues to increase in order to meet customer demands for better performance and lower cost. However, for the two-dimensional or planar memory device, the integration density is determined by the area occupied by unit memory cells. Accordingly, there is being currently developed a three-dimensional memory device which limits (e.g., reduces) the increase of occupied area due to the three-dimensional memory device and enhances integration density by disposing the unit memory cells perpendicularly.

SUMMARY

A technical object of the present disclosure is to provide a semiconductor device enhanced with reliability by reducing generation of misalignment in a channel hole with broad formation of a width of a channel hole between a lower stack structure and an upper stack structure.

According to an exemplary embodiment of the present disclosure, a semiconductor device includes a first substrate, a first stack structure, a second stack structure, a junction layer, a first interlayer insulating layer, a second interlayer insulating layer, a first channel hole and a second channel hole. A first region and a second region are defined in the first substrate. The first stack structure includes a plurality of first gate electrodes which are displaced and stacked sequentially on the first substrate. Lengths of the plurality of first gate electrodes in a first direction decrease in proportion to distances of the first gate electrodes from the first substrate of the second region (as being farther away from the first substrate of the second region). The second stack structure includes a plurality of second gate electrodes which are displaced and stacked sequentially on the first stack structure. The junction layer is disposed between the first stack structure and the second stack structure. The first interlayer insulating layer is disposed on a side surface of the first stack structure. The second interlayer insulating layer covers the second stack structure. The first channel hole includes a first portion penetrating through the first stack structure, a second portion penetrating through the junction layer and a third portion penetrating through the second stack structure on the first substrate of the first region. The second channel hole includes a first portion penetrating through the first stack structure, a second portion penetrating through the first interlayer insulating layer and a third portion penetrating through the second interlayer insulating layer on the first substrate of the second region. A height of the second portion of the first channel hole in a second direction orthogonal to the first direction is less than a height of the second portion of the second channel hole in the second direction.

According to another exemplary embodiment of the present disclosure, a semiconductor device includes a first substrate, a first stack structure, a dummy gate electrode, a second stack structure, a junction layer, a first interlayer insulating layer, a second interlayer insulating layer, a first channel hole and a second channel hole. A first region and a second region are defined in the first substrate. The first stack structure includes a plurality of first gate electrodes which are displaced and stacked sequentially on the first substrate. Lengths of the plurality of first gate electrodes in a first direction decrease in proportion to distances of the first gate electrodes from the first substrate of the second region (as being farther away from the first substrate of the second region). The dummy gate electrode is disposed on the first stack structure. The second stack structure includes a plurality of second gate electrodes which are displaced and stacked sequentially on the dummy gate electrode. The junction layer is disposed between the first stack structure and the dummy gate electrode. The first interlayer insulating layer is disposed on a side surface of the first stack structure. The second interlayer insulating layer covers the second stack structure and the dummy gate electrode. The first channel hole penetrates through the first stack structure, the junction layer, the dummy gate electrode and the second stack structure on the first substrate of the first region. The second channel hole penetrates through the first stack structure, the first interlayer insulating layer, the dummy gate electrode, and the second interlayer insulating layer on the first substrate of the second region.

According to an exemplary embodiment of the present disclosure, a semiconductor device includes a substrate, a first stack structure, a second stack structure, a junction layer, a first interlayer insulating layer, a second interlayer insulating layer, a first channel hole and a second channel hole. A first region and a second region are defined in the substrate. The first stack structure includes a plurality of first gate electrodes which are displaced and stacked sequentially on the substrate. The second stack structure includes a plurality of second gate electrodes which are displaced and stacked sequentially on the first stack structure. The junction layer is disposed between the first stack structure and the second stack structure. The first interlayer insulating layer is disposed on a side surface of the first stack structure. The second interlayer insulating layer covers the second stack structure. The first channel hole includes a first portion penetrating through the first stack structure, a second portion penetrating through the junction layer and a third portion penetrating through the second stack structure on the substrate of the first region. The second channel hole includes a first portion penetrating through the first stack structure, a second portion penetrating through the first interlayer insulating layer and a third portion penetrating through the second interlayer insulating layer on the substrate of the second region. The second channel hole is not in contact with the second stack structure. A width of the second portion of the first channel hole is more than a width of the third portion of the first channel hole.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 1 is a layout view provided to explain a semiconductor device according to some exemplary embodiments.

DETAILED DESCRIPTION

According to some exemplary embodiments, a three-dimensional memory array may include a 'vertical NAND string' in which at least one memory cell is disposed on another memory cell and extended perpendicularly. At least one memory cell may include a charge trap layer.

Hereinbelow, a semiconductor device according to some exemplary embodiments will be described with reference to FIGS. 1 to 4.

Figure 1:
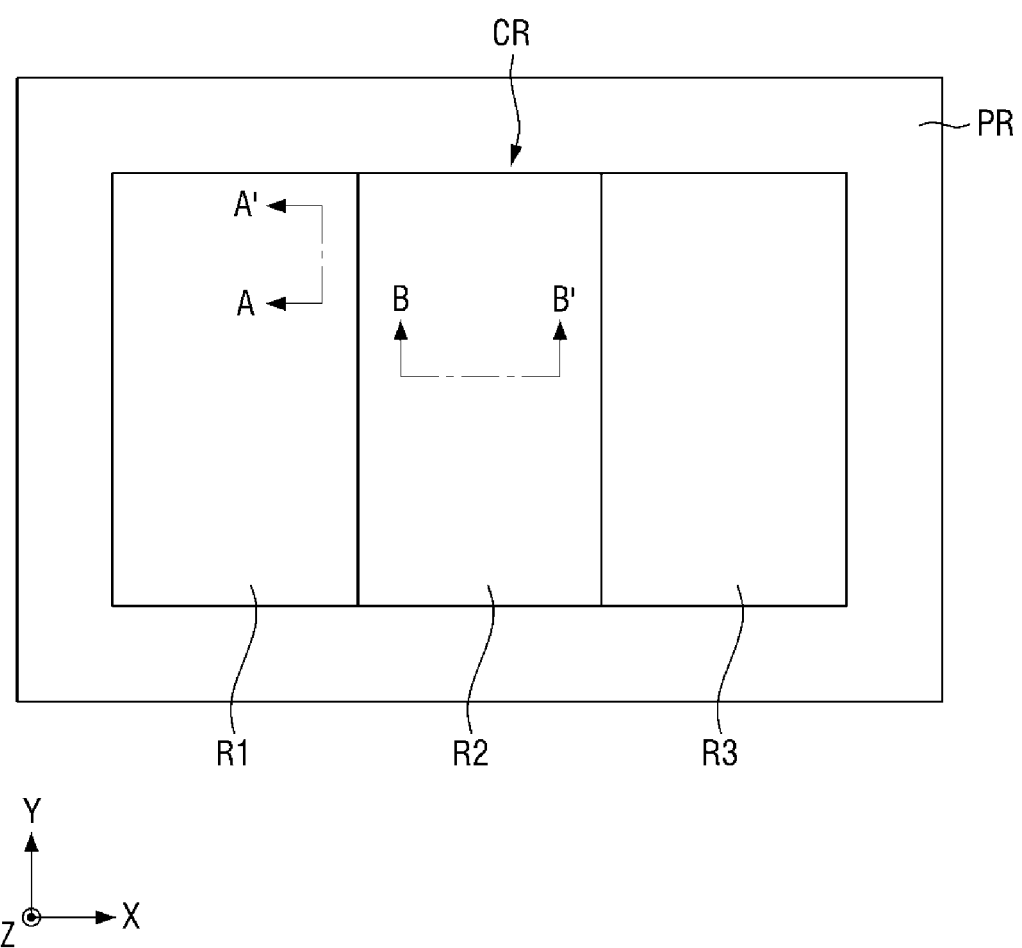
Figure 2:
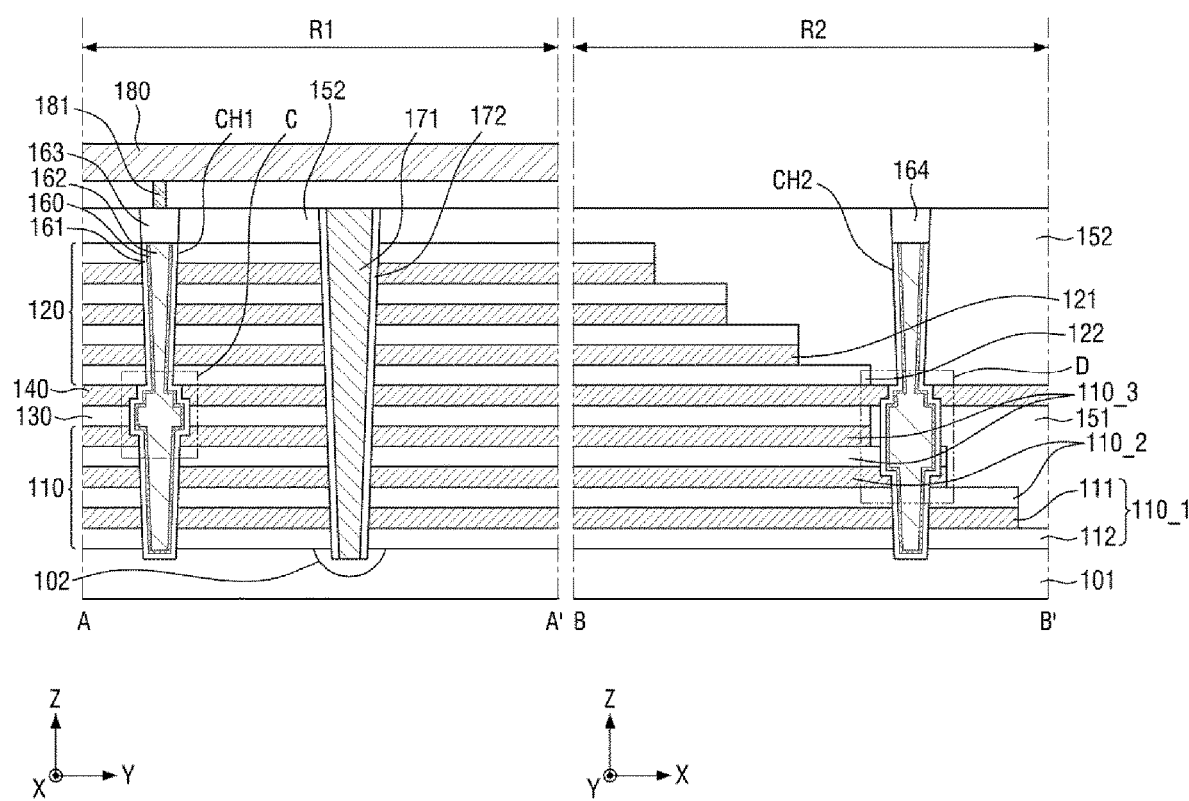
FIG. 2 is a cross-sectional view taken on lines A-A' and B-B' of FIG. 1.
Figure 3:
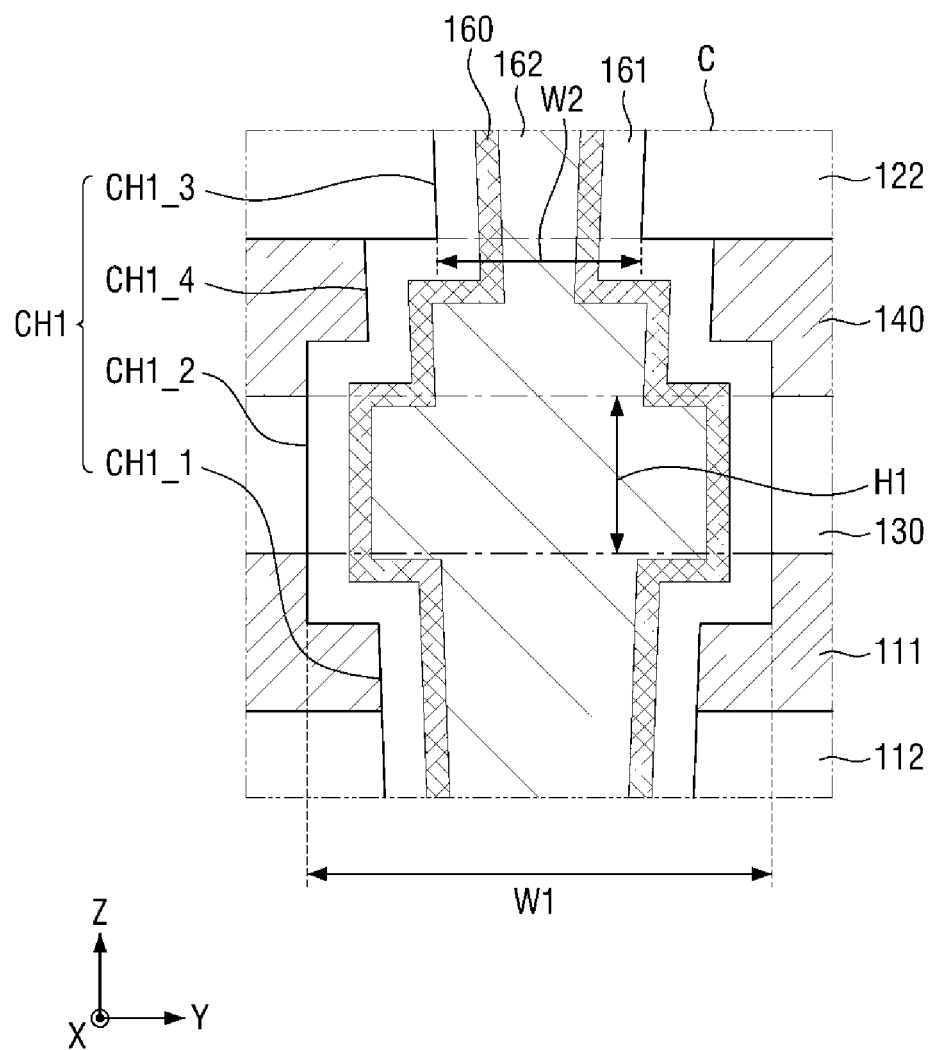
FIG. 3 is a view enlarging a section C of FIG. 2.
Figure 4:
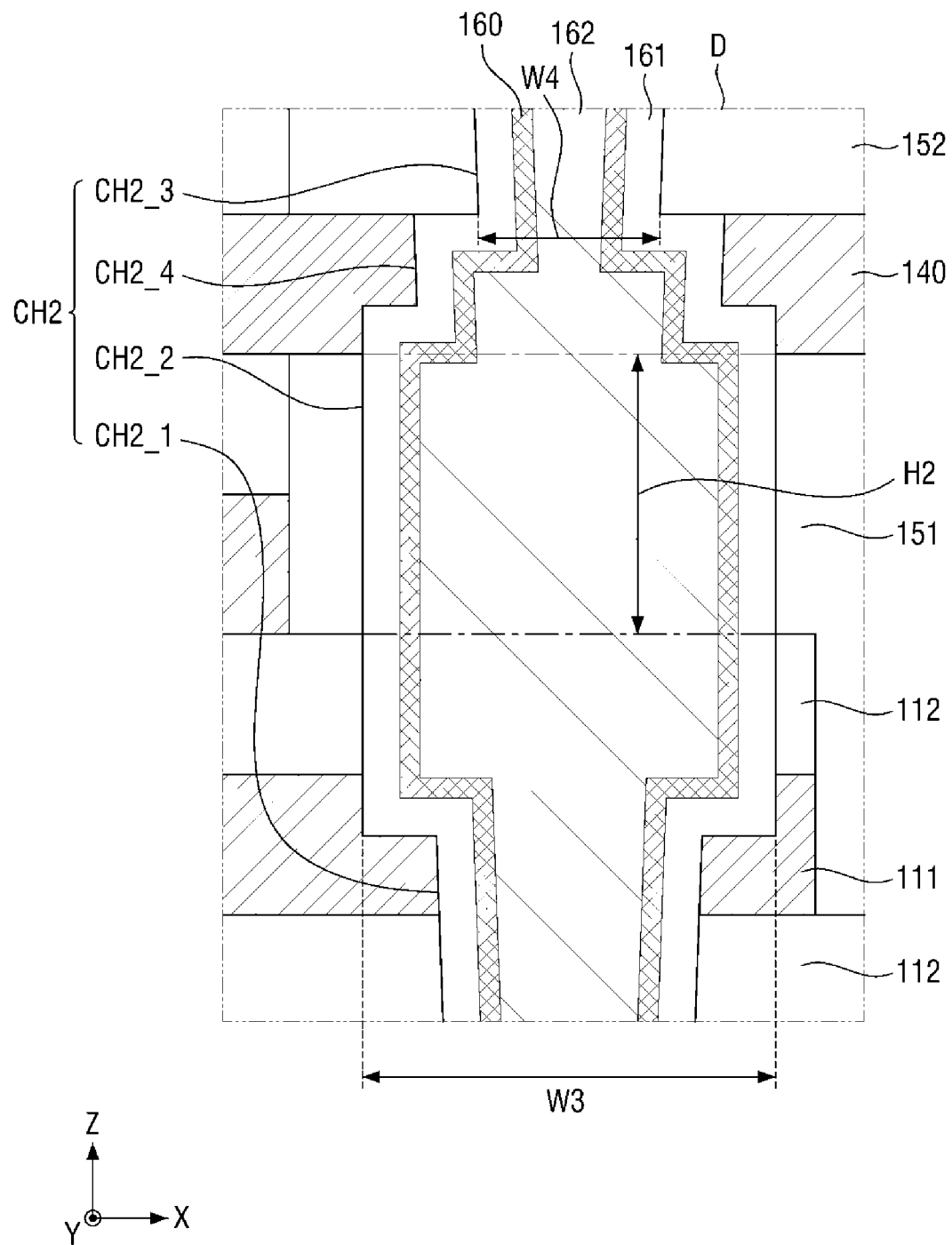
FIG. 4 is a view enlarging a section D of FIG. 2.

FIG. 1 is a layout view provided to explain a semiconductor device according to some exemplary embodiments. FIG. 2 is a cross-sectional view taken on lines A-A' and B-B' of FIG. 1. Notably, the left portion of FIG. 2 is a cross-sectional view taken on lines A-A' in the first region R1 of FIG. 1, and the right portion of FIG. 2 is a cross sectional view taken on lines B-B' in the second region R2 of FIG. 1. FIG. 3 is a view enlarging a section C of FIG. 2. FIG. 4 is a view enlarging a section D of FIG. 2.

Referring to FIG. 1, a semiconductor device according to some exemplary embodiments may include a peripheral circuit region PR and a cell region CR. The cell region CR may include a first region R1, a second region R2, and a third region R3. The first region R1, the second region R2, and the third region R3 are arranged to be sequentially adjacent in a first direction X, and may be regions surrounded by the peripheral circuit region PR. However, the present disclosure is not limited thereto. That is, according to some other exemplary embodiments, the first region R1, the second region R2, and the third region R3 may be regions disposed on the peripheral circuit region PR.

The first region R1 may be a cell array region where multiple (a plurality of) nonvolatile memory cell arrays are disposed. The second region R2 may be a region where multiple vertical wires and multiple pads for routing multiple stacked electrodes (e.g., word lines) are disposed. The third region R3 may be a region where at least one contact for connection of the first region R1 and the second region R2 and connection wires of the peripheral circuit region PR is/are disposed.

Referring to FIGS. 1 to 4, the semiconductor device according to some exemplary embodiments may include a first substrate 101, a first stack structure 110, a second stack structure 120, a junction layer 130, a dummy gate electrode 140, a first interlayer insulating layer 151, a second interlayer insulating layer 152, a channel layer 160, a channel insulating layer 161, a channel filling insulating layer 162, a first conductive pad 163, a second conductive pad 164, a conductive line 171, a line insulating layer 172 and a bit line 180.

The first region R1 and the second region R2 may be defined in the first substrate 101.

The first substrate 101 may include an impurity region 102 provided as a common source line.

The conductive line 171 may be disposed on the first substrate 101 of the first region R1. The conductive line 171 may extend in a second direction Z which is perpendicular to the first substrate 101 and orthogonal to the first direction X. Specifically, the conductive line 171 may penetrate through the first stack structure 110, the junction layer 130, the dummy gate electrode 140, the second stack structure 120 and the second interlayer insulating layer 152 in the second direction Z on the first substrate 101 of the first region R1.

A portion of the conductive line 171 may extend within, for example, the impurity region 102. The line insulating layer 172 may surround the conductive line 171.

The conductive line 171 may include a conductive material. The conductive line 171 may include, for example, tungsten. The conductive line 171 may operate as a common source line in connection with the impurity region 102 of the first substrate 101. The line insulating layer 172 may include an insulating material that can insulate the conductive line 171 from first gate electrodes 111 and second gate electrodes 121.

The first stack structure 110 may be disposed on the first substrate 101. The first stack structure 110 may include multiple of the first gate electrodes 111 which are displaced sequentially and stacked on the first substrate 101. For example, the first gate electrodes 111 may be displaced (e.g., spaced apart, separated) sequentially from one another by intervening layers. Also, as illustrated in FIG. 2, the first gate electrodes 111 may be all be displaced (e.g., spaced apart, separated) from the first substrate 101 so that none of the first gate electrodes 111 are directly adjacent to the first substrate 101 and so that an intervening layer is provided between the first substrate 101 and even the lowest of the first gate electrodes 111.

Although it is illustrated in FIG. 2 that the first stack structure 110 includes three of the first gate electrodes 111, this is only exemplary, and a number of the first gate electrodes 111 included in the first stack structure 110 is not limited to three.

The first stack structure 110 may include a first layer 110_1, a second layer 110_2 and a third layer 110_3 which are sequentially stacked on the first substrate 101. Each of the first layer 110_1, the second layer 110_2, and the third layer 110_3 may include a first insulating layer 112 and a different respective one of the first gate electrodes 111 disposed respectively on the first insulating layer 112. That is, the first stack structure 110 may have structure in which the first insulating layer 112 and respective ones of the first gate electrodes 111 are alternately stacked with each other in each of the first layer 110_1, the second layer 110_2, and the third layer 110_3. The first layer 110_1, the second layer 110_2, and the third layer 110_3 may combined respectively have a stair shape in the profile view defined in the first direction X and the second direction Z on the right side of FIG. 2. The first insulating layer 112 in each of the first layer 110_1, the second layer 110_2 and the third layer 11-_3 may be the intervening layer described above. That is, a first insulating layer 112 may be provided to spatially/physically intervene between the first substrate 101 and the lowest of the first gate electrodes 111, and to spatially/physically intervene between any two of the first gate electrodes 111 in adjacent layers among the first layer 110_1, the second layer 110_2 the third layer 110_3 and any other such layers in the first stack structure 110.

Multiple of the first gate electrodes 111 may extend in a first direction X. Lengths of the first gate electrodes 111 in the first direction X may decrease in proportion to the distances of the first gate electrodes 111 from the first substrate 101 of the second region R1. That is, the length of each of the first gate electrodes 111 in the first direction X may vary from one another so as to decrease proportionate to distance away from the first substrate 101 of the second region R2. This is shown in the right portion of FIG. 2, which is a cross sectional view taken on lines B-B' in the second region R2 of FIG. 1. Specifically, the further any of the first gate electrodes 111 is from the first substrate 101, the lower the length of the first gate electrode 111 and the first insulating layer 112 corresponding in the same layer in the first direction X.

Each of the first gate electrodes 111 may include a conductive material. Each of the first gate electrodes 111 may include, for example, a conductive material such as tungsten W, cobalt Co, nickel Ni or the like, or a semiconductor material such as silicon, although the present disclosure is not limited thereto.

Although it is illustrated in FIG. 2 that the first gate electrodes 111 are formed as a single layer, the present disclosure is not limited thereto. That is, according to some other exemplary embodiments, the first gate electrodes 111 may each include a multi-layered structure.

The first gate electrodes 111 may each operate as a word line. For example, each of multiple of the first gate electrodes 111 may operate as word lines which are different from one another.

Although it is not illustrated for convenience of explanation in FIG. 2, a word line contact may be disposed on the second region R2. The word line contact may extend from each of the first gate electrodes 111 in the second direction Z.

The first insulating layer 112 may include at least one of low-k dielectric material, oxide film, nitride film and oxynitride film, for example.

The junction layer 130 may be disposed on the first stack structure 110. The junction layer 130 may be disposed on one of the first gate electrodes 111 of the third layer 110_3 which is an uppermost layer of the first stack structure 110.

The junction layer 130 may include at least one of low-k dielectric material, oxide film, nitride film and oxynitride film, for example. The junction layer 130 may include, for example, the same material as the first insulating layer 112, although the present disclosure is not limited thereto.

The first interlayer insulating layer 151 may be disposed on a side surface of the first stack structure 110. That is, the first interlayer insulating layer 151 is provided to the right side in the first direction X on the right side of FIG. 2, so as to be on the on the side of each of the first layer 110_1, the second layer 110_2 and the third layer 110_3, as well as the first gate electrodes 111 and first insulating layer 112 components of each of the first layer 110_1, the second layer 110_2 and the third layer 110_3, in the first direction X.

The first interlayer insulating layer 151 may include at least one of low-k dielectric material, oxide film, nitride film and oxynitride film, for example. The first interlayer insulating layer 151 may include, for example, the same material as the first insulating layer 112 and the junction layer 130, although the present disclosure is not limited thereto.

The dummy gate electrode 140 may be disposed on the junction layer 130. The dummy gate electrode 140 may be protruded in the first direction X on the first substrate 101 of the second region R2 more than each of multiple of the first gate electrodes 111. That is, whereas the lengths of the first gate electrodes 111 may decrease in the first direction X in accordance with distance from the first substrate 101, the dummy gate electrode 140 protrudes in the first direction X as much or more than each of the first gate electrodes 111 in the first direction X. This is shown in the view of R2 on the right side of FIG. 2. However, the present disclosure is not limited thereto.

The dummy gate electrode 140 may include a material having a same etch selectivity as the first gate electrodes 111. The dummy gate electrode 140 may include, for example, the same material as the first gate electrodes 111, although the present disclosure is not limited thereto.

The second stack structure 120 may be disposed on the first stack structure 110. The second stack structure 120 may include multiple of the second gate electrodes 121 which are displaced sequentially and stacked on the first stack structure 110. For example, the second gate electrodes 121 may be displaced (e.g., spaced apart, separated) sequentially from one another by intervening layers. Also, as illustrated in FIG. 2, the second gate electrodes 121 may be all be displaced (e.g., spaced apart, separated) from the first stack structure 110 so that none of the second gate electrodes 121 are directly adjacent to the first stack structure 110 and so that an intervening layer is provided between the first stack structure 110 and even the lowest of the second gate electrodes 121.

Although it is illustrated in FIG. 2 that the second stack structure 120 includes three of the second gate electrodes 121, this is only exemplary, and a number of the second gate electrodes 121 included in the second stack structure 120 is not limited to three.

The second stack structure 120 may have structure in which a second insulating layer 122 and one of the second gate electrodes 121 are alternately stacked. The second stack structure 120 may have a stair shape. For example, the second insulating layer 122 disposed on a lowermost portion of the second stack structure 120 may be entirely overlapped with the junction layer 130 in the second direction Z. However, the present disclosure is not limited thereto.

A second insulating layer 122 may be disposed on or as an uppermost portion of the second stack structure 120, although the present disclosure is not limited thereto. Alternatively, according to some other exemplary embodiments, one of the second gate electrodes 121 may be disposed on or as an uppermost portion of the second stack structure 120.

Each of multiple of the second gate electrodes 121 may extend in the first direction X. Lengths of the second gate electrodes 121 in the first direction X may decrease in proportion to distance from the first substrate 101 of the second region R2 (i.e., as being farther away from the first substrate 101 of the second region R2). That is, the lengths of the second gate electrodes 121 may vary from one another in proportion to distance of each of the second gate electrodes 121 from the first substrate 101 of the second region R1.

Each of the second gate electrodes 121 may include a conductive material. Each of the second gate electrodes 121 may include, for example, a conductive material such as tungsten W, cobalt, nickel or the like, or a semiconductor material such as silicon, although the present disclosure is not limited thereto.

Each of the second gate electrodes 121 may include a material having a same etch selectivity as the dummy gate electrode 140.

Although it is illustrated in FIG. 2 that the second gate electrodes 121 are formed as a single layer, the second gate electrodes 121 may each have a multi-layered structure according to some other exemplary embodiments.

Each of the second gate electrodes 121 may operate as a word line. For example, each of multiple of the second gate electrodes 121 may operate as word lines which are different from one another.

Although it is not illustrated in FIG. 2 for convenience of explanation, the word line contact may extend in the second direction Z from each of the second gate electrodes 121.

The second insulating layer 122 may include at least one of low-k dielectric material, oxide film, nitride film and oxynitride film, for example.

The second interlayer insulating layer 152 may be formed to cover the second stack structure 120 and the dummy gate electrode 140. That is, the second interlayer insulating layer 152 may cover exposed surfaces of the second stack structure 120 and the dummy gate electrode 140 in the second direction Z, as shown in the second regions R2 on the right side of FIG. 2. Thus, the covering by the second interlayer insulating layer 152 may be on surfaces in the second direction Z, whereas the disposition of the first interlayer insulating layer 151 may be adjacent to surfaces in the first direction X.

The second interlayer insulating layer 152 may include at least one of low-k dielectric material, oxide film, nitride film and oxynitride film, for example. The second interlayer insulating layer 152 may include the same material as the second insulating layer 122, for example, although the present disclosure is not limited thereto.

The first channel hole CH1 may penetrate through the first stack structure 110, the junction layer 130, the dummy gate electrode 140, the second stack structure 120 and the second interlayer insulating layer 152 in the second direction Z on the first substrate 101 of the first region R1. A first channel hole CH1 may extend fully or partially in an internal portion of the first substrate 101. The first channel hole CH1 may be displaced from the conductive line 171 and the line insulating layer 172. That is, the first channel hole CH1 may be spaced apart in the third direction Y from the conductive line 171 and the line insulating layer 172. Portions of the first stack structure 110, the junction layer 130, the dummy gate electrode 140, the second stack structure 120 and the second interlayer insulating layer 152 may extend between the first channel hole CH1 and the conductive line 171 and the line insulating layer 172 in the third direction Y. This can be seen in the first region R1 shown on the left side of FIG. 2, though the second interlayer insulating layer 152 between the top of the second stack structure 120 and the bottom of a bit line contact 181 in the first region R1 on the left side of FIG. 2 is not labelled.

Referring to FIGS. 2 and 3, the first channel hole CH1 may include a first portion CH1_1 penetrating through the first stack structure 110, a second portion CH1_2 penetrating through the junction layer 130, a third portion CH1_3 penetrating through the second stack structure 120, and a fourth portion CH1_4 penetrating through the dummy gate electrode 140. The first portion CH1_1, the second portion CH1_2, the third portion CH1_3 and the fourth portion CH1_4 may be proportionate in dimension, or even equivalent in dimension, to the respective structures, layer and electrode through which the portions penetrate. Additionally, the first portion CH1_1, the second portion CH1_2, the third portion CH1_3 and the fourth portion CH1_4 may penetrate the respective structures, layer and electrode without penetrating others of the structures, layer and electrode. Thus, the first portion CH1_1, the second portion CH1_2, the third portion CH1_3 and the fourth portion CH1_4 may correspond in at least in the Z dimension to the respective structures, layer and electrode through which the portions penetrate.

Additionally, widths of the first portion CH1_1, the second portion CH1_2, the third portion CH1_3 and the fourth portion CH1_4 in the third direction Y may vary, as described herein. For example, the first portion CH1_1, the second portion CH1_2, the third portion CH1_3 and/or the fourth portion CH1_4 may be tapered in the third direction Y, so that the width in the third direction Y for any of these portions may vary in/along the second direction Z.

An upper surface of the fourth portion CH1_4 of the first channel hole CH1 in the dummy gate electrode 140 may be in contact with the second insulating layer 122 disposed on a lowermost portion of the second stack structure 120. A sidewall of the fourth portion CH1_4 of the first channel hole CH1 may have a stair shape within the dummy gate electrode 140. However, the present disclosure is not limited thereto. That is, according to some other exemplary embodiments, a sidewall of the first channel hole CH1 may have a stair shape on a boundary between the second portion CH1_2 of the first channel hole CH1 and the fourth portion CH1_4 of the first channel hole CH1.

A sidewall of the first portion CH1_1 of the first channel hole CH1 in the first stack structure 110 may have a stair shape within one of the first gate electrodes 111 disposed on or as an uppermost portion of the first stack structure 110. However, the present disclosure is not limited thereto. Alternatively, according to some other exemplary embodiments, a sidewall of the first channel hole CH1 may have a stair shape on a boundary between the first portion CH1_1 of the first channel hole CH1 and the second portion CH1_2 of the first channel hole CH1.

A width W1 in the second portion CH1_2 of the first channel hole CH1 in a third direction Y may be more than a width W2 in a lower surface of the third portion CH1_3 of the first channel hole CH1 in the third direction Y. Further, a width W1 in the second portion CH1_2 of the first channel hole CH1 in the third direction Y may be more than a width on an upper surface of the first portion CH1_1 of the first channel hole CH1 in the third direction Y. That is, a width in the third direction Y in the first channel hole CH1 disposed within the junction layer 130 may be formed to be greater than a width in the third direction Y in the first channel hole CH1 disposed within the first stack structure 110 and a width in the third direction Y in the first channel hole CH1 disposed within the second stack structure 120. Herein, the third direction Y may be perpendicular to the first direction X and the second direction Z.

A first channel may be formed within the first channel hole CH1. A portion of the first channel may extend within the first substrate 101. The first channel may include the channel layer 160, the channel insulating layer 161, and the channel filling insulating layer 162.

The channel insulating layer 161 may be disposed along a sidewall and a bottom surface of the first channel hole CH1. The channel insulating layer 161 may include, for example, a tunneling insulating layer, a charge storing layer and a blocking insulating layer.

The tunneling insulating layer may pass through charge between a surface layer and the charge storing layer, for example. The charge storing layer may, for example, store the charge passing through the tunneling insulating layer between the blocking insulating layer and the tunneling insulating layer. For example, the blocking insulating layer may prevent the charge captured in the charge storing layer from being discharged to the first gate electrodes 111 and the second gate electrodes 121.

The channel layer 160 may be disposed within the first channel hole CH1 along the channel insulating layer 161. The channel layer 160 may operate in a channel region. The channel layer 160 may provide charge to be trapped or discharged by the channel insulating layer 161.

The channel filling insulating layer 162 may be disposed so as to fill an inner portion of the first channel hole CH1 on the channel layer 160. The channel filling insulating layer 162 may include an insulating material.

The first conductive pad 163 may be disposed on the channel layer 160, the channel insulating layer 161, and the channel filling insulating layer 162 within the first channel hole CH1. The first conductive pad 163 may function as a bit line pad.

The bit line 180 may extend in the third direction Y on the first substrate 101 of the first region R1. The bit line 180 may be disposed on the first conductive pad 163. The bit line 180 may be electrically connected to the first conductive pad 163 through a bit line contact 181.

A second channel hole CH2 may penetrate through the first stack structure 110, the first interlayer insulating layer 151, the dummy gate electrode 140, and the second interlayer insulating layer 152 in the second direction Z on the first substrate 101 of the second region R2. The second channel hole CH2 may extend within the first substrate 101.

Referring to FIGS. 2 and 4, the second channel hole CH2 may include a first portion CH2_1 penetrating through the first stack structure 110, a second portion CH2_2 penetrating through the first interlayer insulating layer 151, a third portion CH2_3 penetrating through the second interlayer insulating layer 152 and a fourth portion CH4_4 penetrating through the dummy gate electrode 140.

An upper surface of the fourth portion CH2_4 of the second channel hole CH2 may be in contact with the second interlayer insulating layer 152. A sidewall of the fourth portion CH2_4 of the second channel hole CH2 may have a stair shape within the dummy gate electrode 140. However, the present disclosure is not limited thereto. That is, according to some other exemplary embodiments, a sidewall of the second channel hole CH2 may have a stair shape on a boundary between the second portion CH2_2 of the second channel hole CH2 and the fourth portion CH2_4 of the second channel hole CH2.

A sidewall of the first portion CH2_1 of the second channel hole CH2 may have a stair shape within one of the first gate electrodes 111 disposed on the first layer 110_1 of the first stack structure 110. However, the present disclosure is not limited thereto. That is, according to some other exemplary embodiments, a sidewall of the second channel hole CH2 may have a stair shape on a boundary between the first portion CH2_1 of the second channel hole CH2 and the second portion CH2_2 of the second channel hole CH2.

A width W3 of the second portion CH2_2 of the second channel hole CH2 in the first direction X may be more than a width W4 on a lower surface of the third portion CH3_3 of the second channel hole CH2 in the first direction X.

A height H2 of the second portion CH2_2 of the second channel hole CH2 in the second direction Z in FIG. 4 may be more than a height H1 of the second portion CH1_2 of the first channel hole CH1 in the second direction Z in FIG. 3. That is, the height H2 of the second portion CH2_2 of the second channel hole CH2 through the first interlayer insulating layer 151 in the second direction Z may be more than a height H1 of the first channel hole CH1 through the junction layer 130 in the second direction Z.

The second channel hole CH2 may not be in contact with the second stack structure 120. That is, the second channel hole CH2 may not penetrate through the second stack structure 120. However, the present disclosure is not limited thereto. That is, according to some other exemplary embodiments, the second channel hole CH2 may penetrate through at least a portion thereof.

Within the second channel hole CH2, a second channel may be formed. A portion of the second channel may extend within the first substrate 101. The second channel may include the channel layer 160, the channel insulating layer 161 and the channel filling insulating layer 162.

The channel insulating layer 161 may be disposed along a sidewall and a bottom surface of the second channel hole CH2. The channel layer 160 may be disposed within the second channel hole CH2 along the channel insulating layer 161. The channel filling insulating layer 162 may be disposed to fill an inner portion of the second channel hole CH2 on the channel layer 160.

The second conductive pad 164 may be disposed on the channel layer 160, the channel insulating layer 161 and the channel filling insulating layer 162 within the second channel hole CH2. The second conductive pad 164 may be insulated electrically from the bit line 180.

The semiconductor device according to some exemplary embodiments may reduce occurrence of misalignment between the channel hole portion CH1_1 penetrating through the first stack structure 110 (the lower stack structure) and the channel hole portion CH1_3 penetrating through the second stack structure 120 (the upper stack structure) by broadly forming a width of the channel hole CH1 between the first stack structure 110 including one of the first gate electrodes 111 and the second stack structure 120 including one of the second gate electrodes 121.

Hereinbelow, a method for fabricating a semiconductor device according to some exemplary embodiments will be described with reference to FIGS. 5 to 20.

FIGS. 5 to 20 are views illustrating intermediate stages of fabrication, provided to explain a method for fabricating a semiconductor device according to some exemplary embodiments.

Figure 5:
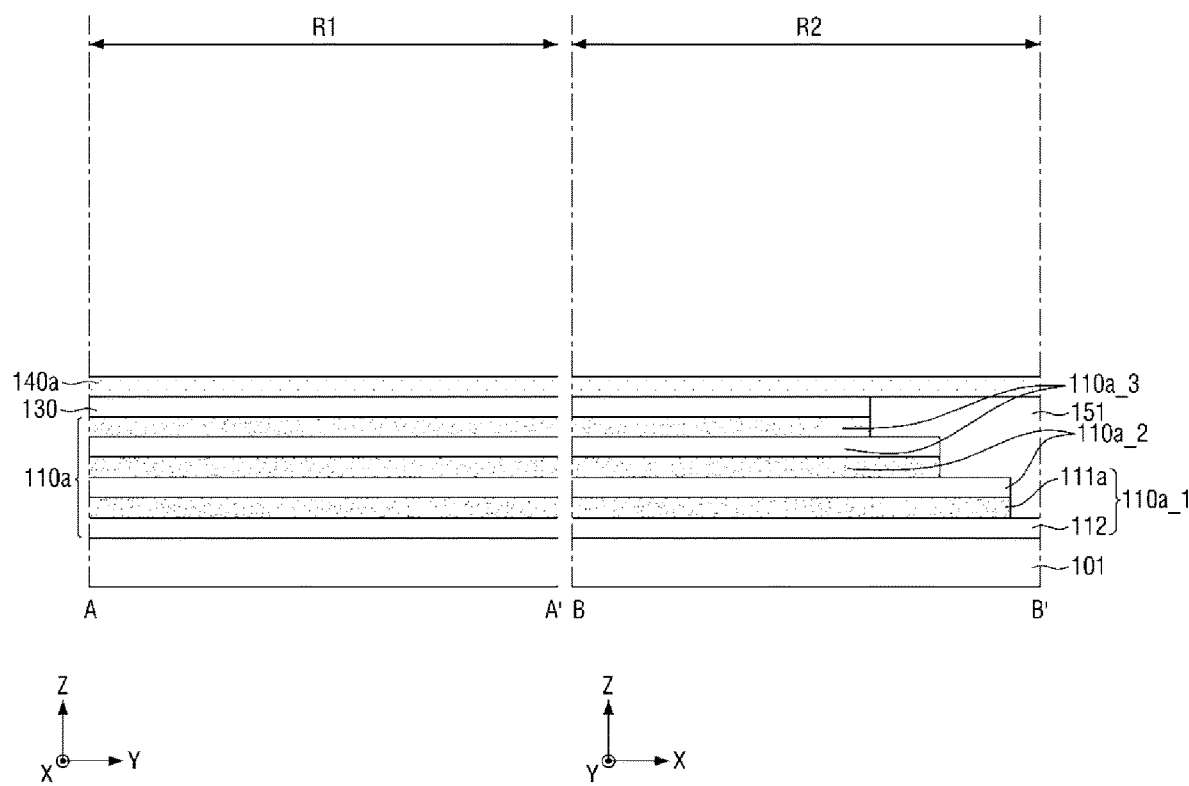
FIG. 5 is a view illustrating intermediate stages of fabrication, and is provided to explain a method for fabricating a semiconductor device according to some exemplary embodiments.

Referring to FIG. 5, a first pre stack structure 110a in which a first pre layer 110a_1, a second pre layer 110a_2 and a third pre layer 110a_3 are sequentially stacked may be formed on the first substrates 101 in each of the first region R1 and the second region R2. Each of the first pre layer 110a_1, the second pre layer 110a_2 and the third pre layer 110a_3 may have a stair shape.

Each of the first pre layer 110a_1, the second pre layer 110a_2 and the third pre layer 110a_3 may include the first insulating layer 112 and a first pre gate layer 111a formed on the first insulating layer 112. The first pre gate layer 111a may include silicon nitride SiN, for example.

The first interlayer insulating layer 151 may be formed on a side surface of the first pre stack structure 110a and a side surface of the junction layer 130.

The junction layer 130 and the pre dummy gate layer 140a may be formed on the first pre stack structure 110a. The pre dummy gate layer 140a may include silicon nitride SiN, for example.

Figure 6:
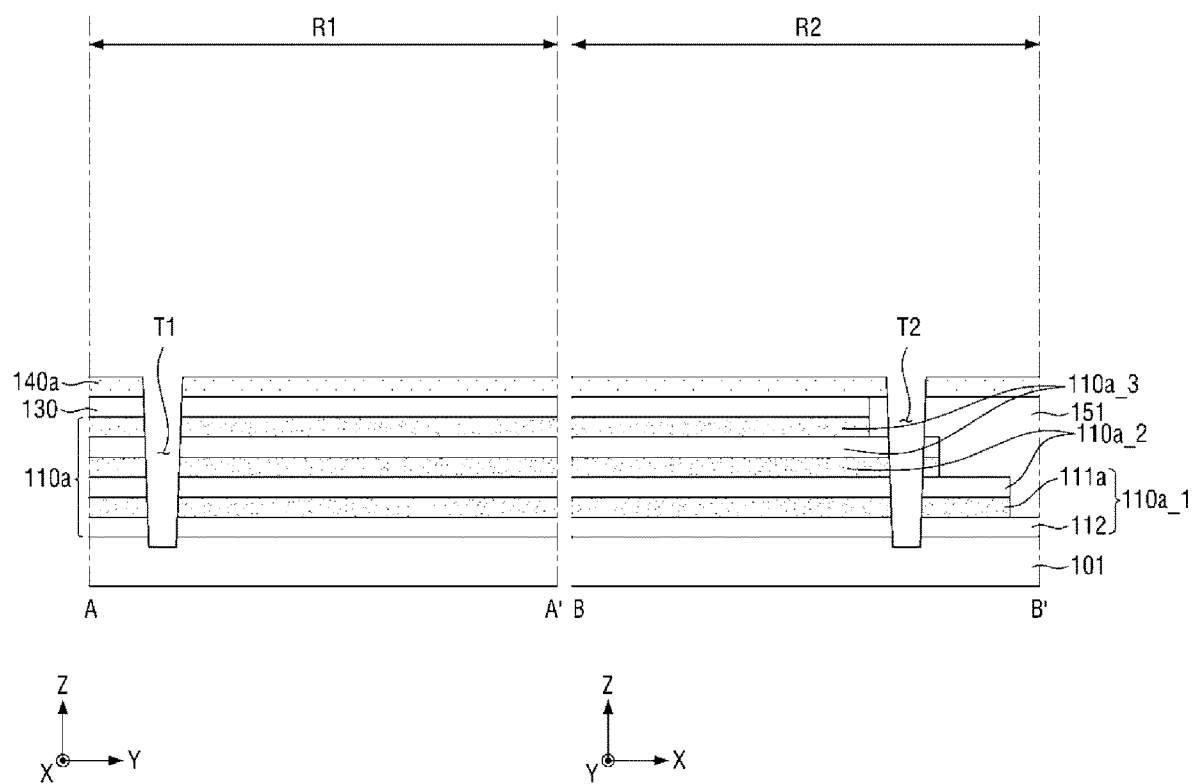
FIG. 6 is another view illustrating intermediate stages of fabrication, and is provided to explain a method for fabricating a semiconductor device according to some exemplary embodiments.

Referring to FIG. 6, a first trench T1, which penetrates through the first pre stack structure 110a, the junction layer 130 and the pre dummy gate layer 140a in the second direction Z on the first substrate 101 of the first region R1, may be formed. Further, a second trench T2, which penetrates through a portion of the first pre stack structure 110a, the first interlayer insulating layer 151 and the pre dummy gate layer 140a in the second direction Z on the first substrate 101 of the second region R2, may be formed.

Figure 7:
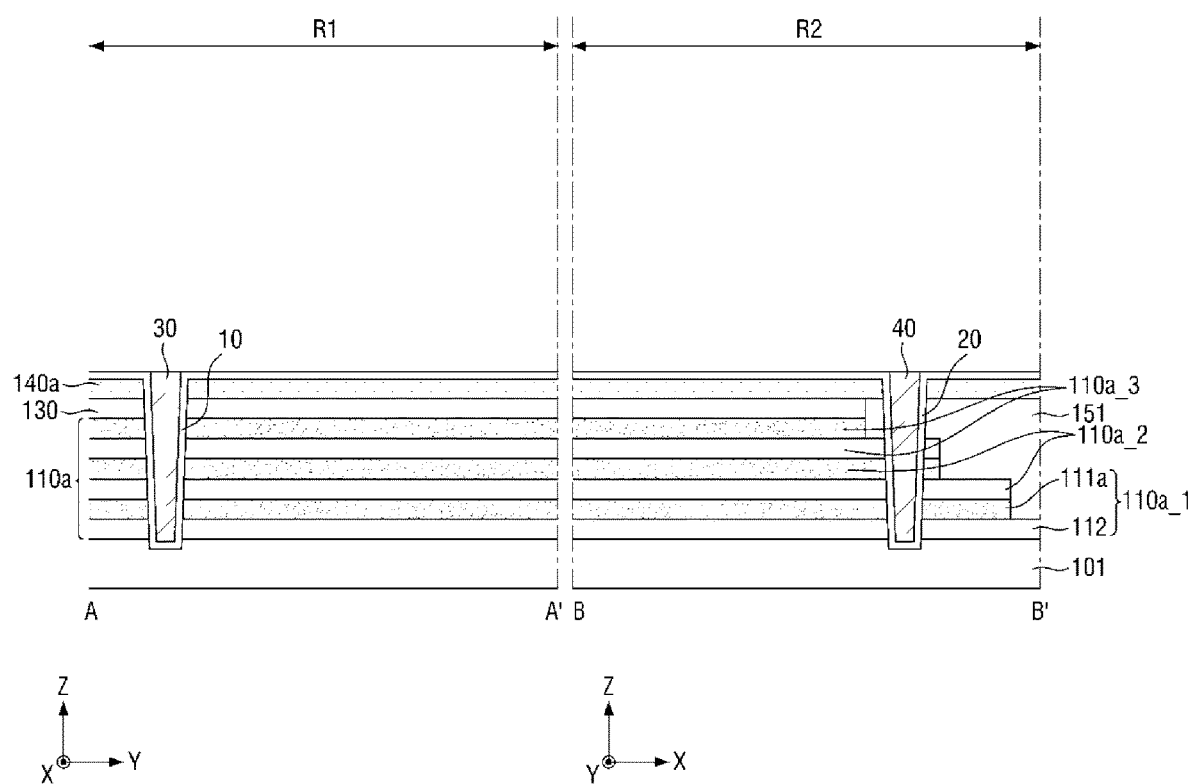
FIG. 7 is another view illustrating intermediate stages of fabrication, and is provided to explain a method for fabricating a semiconductor device according to some exemplary embodiments.

Referring to FIG. 7, a first protective layer 10 may be formed along an upper surface of the pre dummy gate layer 140a of the first region R1, and a sidewall and a bottom surface of the first trench T1. Further, a second protective layer 20 may be formed along an upper surface of the pre dummy gate layer 140a of the second region R2, and a sidewall and a bottom surface of the second trench T2.

Each of the first protective layer 10 and the second protective layer 20 may include, for example, silicon nitride SiN.

Next, a first sacrificial layer 30 may be formed on the first protective layer 10 so as to fill an inner portion of the first trench T1. Further, a second sacrificial layer 40 may be formed on the second protective layer 20 so as to fill an inner portion of the second trench T2.

Each of the first sacrificial layer 30 and the second sacrificial layer 40 may, for example, include at least one of polysilicon and metal.

Figure 8:
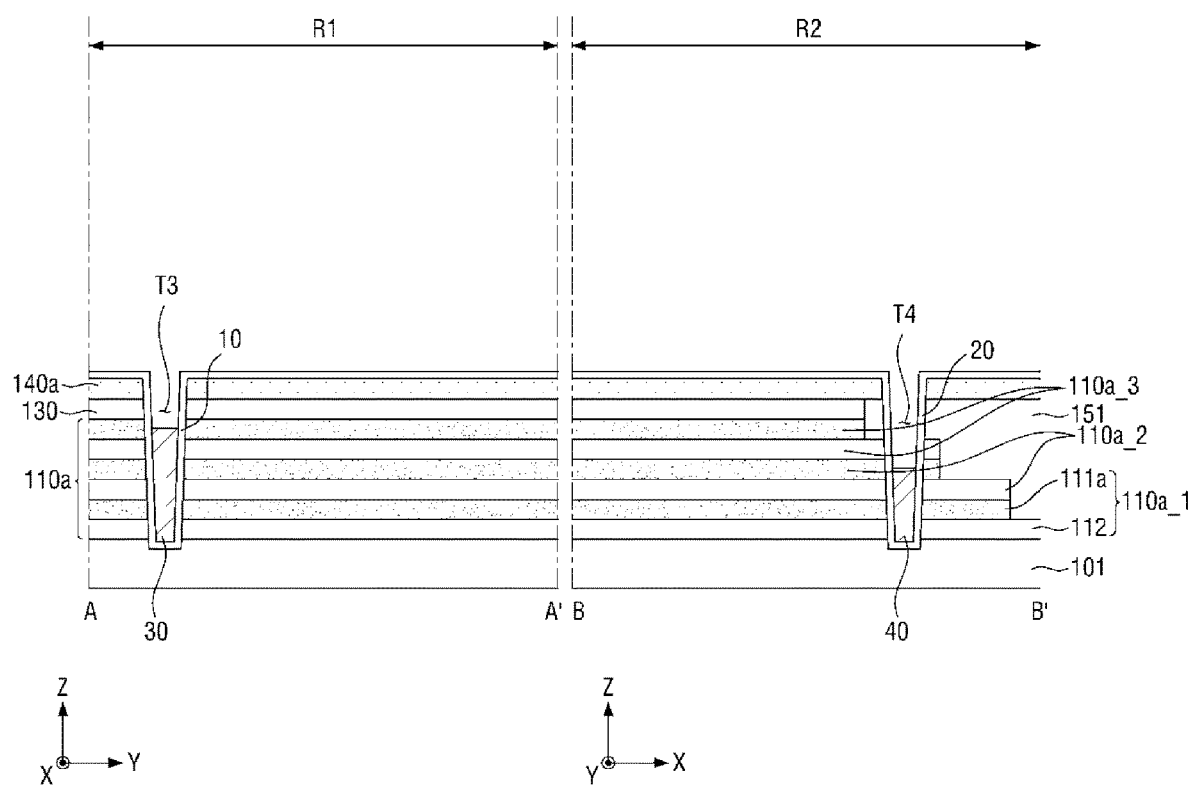
FIG. 8 is another view illustrating intermediate stages of fabrication, and is provided to explain a method for fabricating a semiconductor device according to some exemplary embodiments.

Referring to FIG. 8, a third trench T3 may be formed as a portion of the first sacrificial layer 30 formed within the first trench T1 is removed. In this case, an upper surface of the first sacrificial layer 30 remained within the first trench T1 may be formed to be nearer to the first substrate 101 than an upper surface of the first pre gate layer 111a formed on the third pre layer 110a_3.

Further, a fourth trench T4 may be formed as a portion of the second sacrificial layer 40 formed within the second trench T2 is removed. In this case, an upper surface of the second sacrificial layer 40 remained within the second trench T2 may be formed to be nearer to the first substrate 101 than an upper surface of the first pre gate layer 111a of the second pre layer 110a_2.

Figure 9:
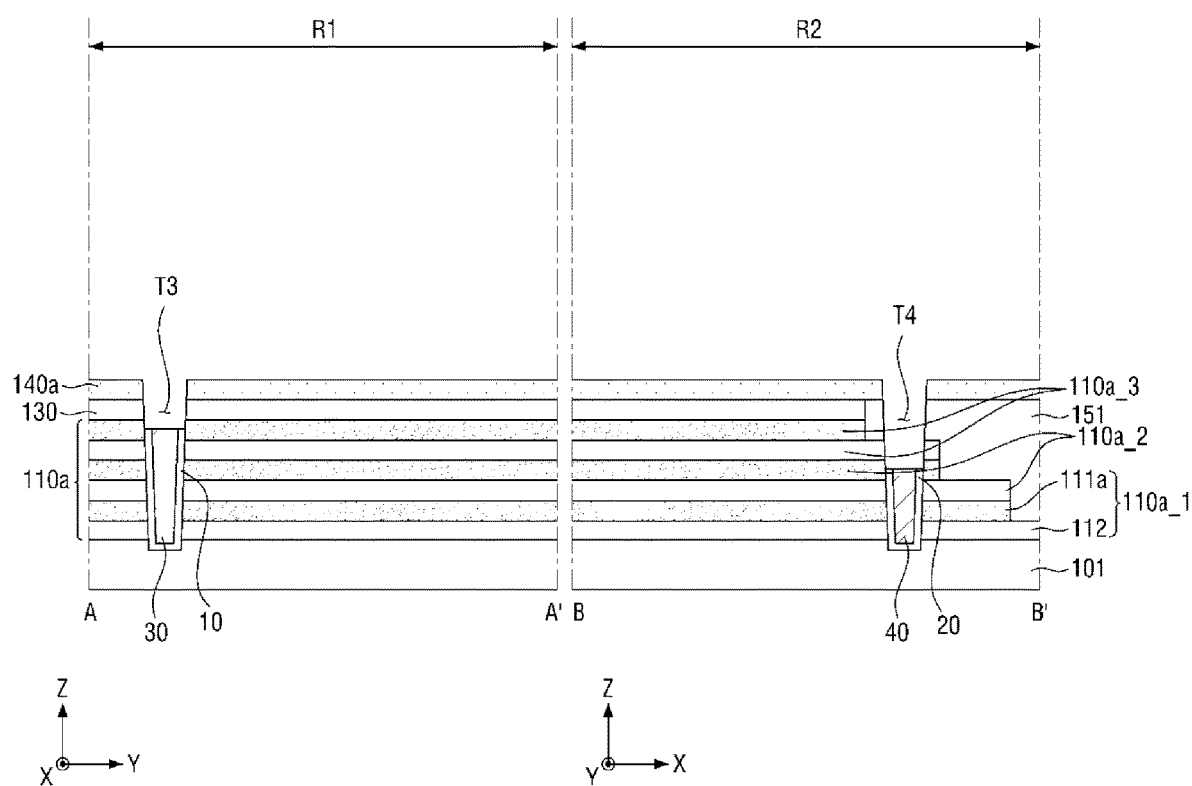
FIG. 9 is another view illustrating intermediate stages of fabrication, and is provided to explain a method for fabricating a semiconductor device according to some exemplary embodiments.

Referring to FIG. 9, the first protective layer 10 formed on a sidewall of the third trench T3 and an upper surface of the pre dummy gate layer 140a of the first region R1 may be removed. Further, the first protective layer 10 formed on a sidewall of the fourth trench T4 and an upper surface of the pre dummy gate layer 140a of the second region R2 may be removed.

Figure 10:
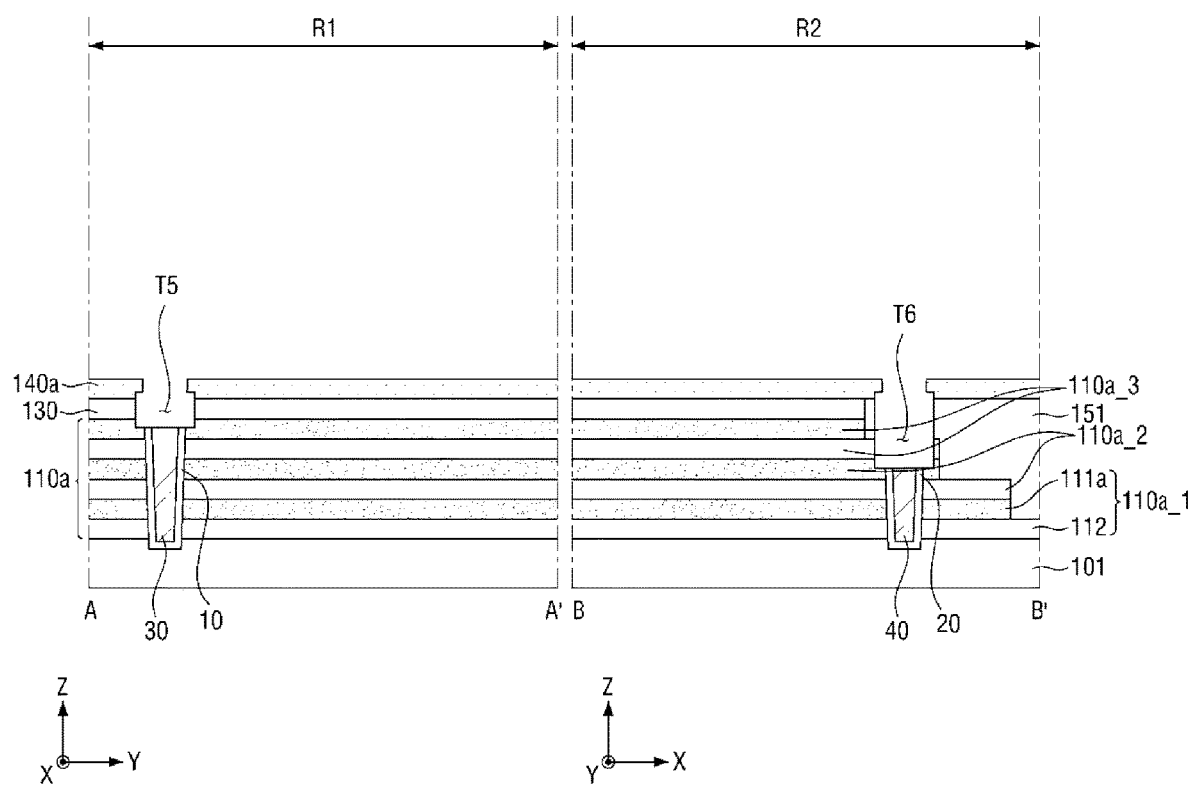
FIG. 10 is another view illustrating intermediate stages of fabrication, and is provided to explain a method for fabricating a semiconductor device according to some exemplary embodiments.

Referring to FIG. 10, a fifth trench T5 has a width in the third direction Y that increases compared to the third trench T3 and may be formed by removing a portion of the junction layer 130 exposed within the third trench T3 through the wet etch process. While the fifth trench T5 is formed, a part of a lower portion of the pre dummy gate layer 140a and a part of an upper portion of the third pre layer 110a_3 may be removed.

Further, through the wet etch process, a sixth trench T6 has a width in the first direction X that increases compared to the fourth trench T4 and may be formed by removing a portion of the first interlayer insulating layer 151 and a portion of the second pre layer 110a_2 exposed within the fourth trench T4. While the sixth trench T6 is formed, a part of a lower portion of the pre dummy gate layer 140a and a part of an upper portion of the second pre layer 110a_2 may be removed.

Figure 11:
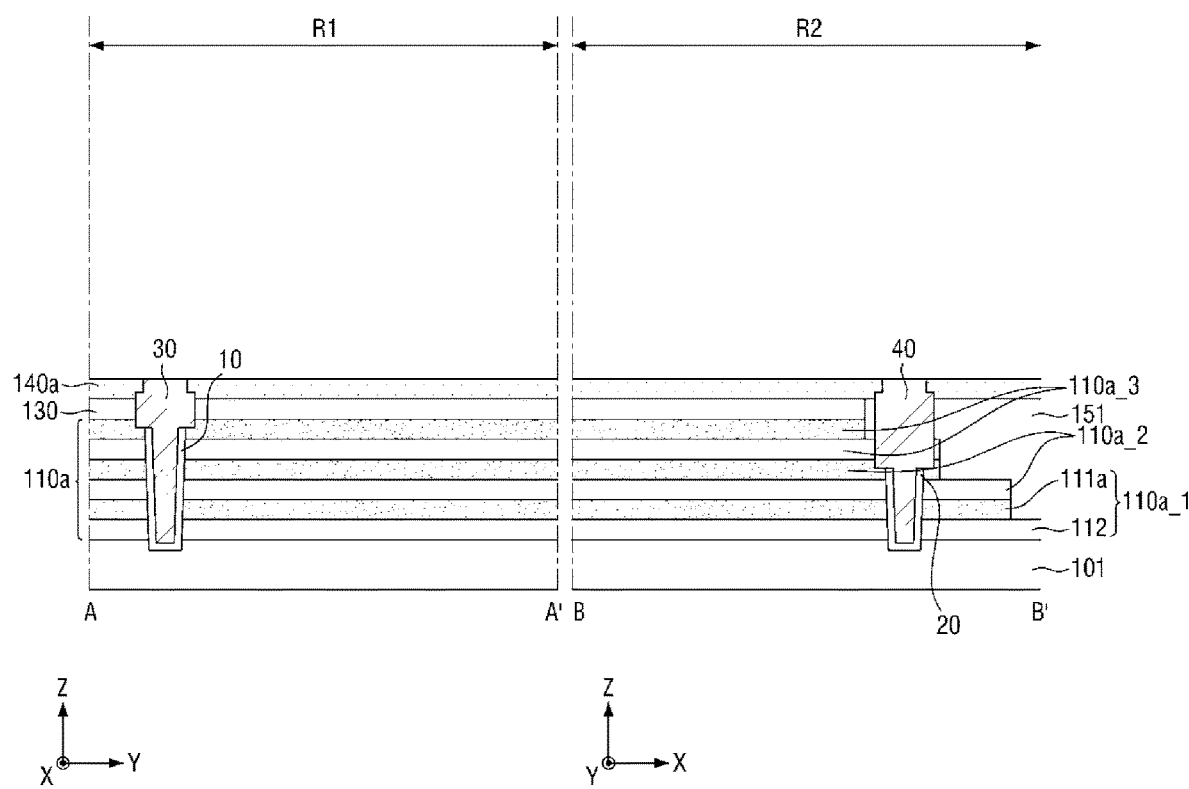
FIG. 11 is another view illustrating intermediate stages of fabrication, and is provided to explain a method for fabricating a semiconductor device according to some exemplary embodiments.

Referring to FIG. 11, the first sacrificial layer 30 may be filled within the fifth trench T5 and the second sacrificial layer 40 may be filled within the sixth trench T6. Through the planarization process, an upper surface of the first sacrificial layer 30, an upper surface of the second sacrificial layer 40 and the pre dummy gate layer 140a may be formed on a same flat plane.

Figure 12:
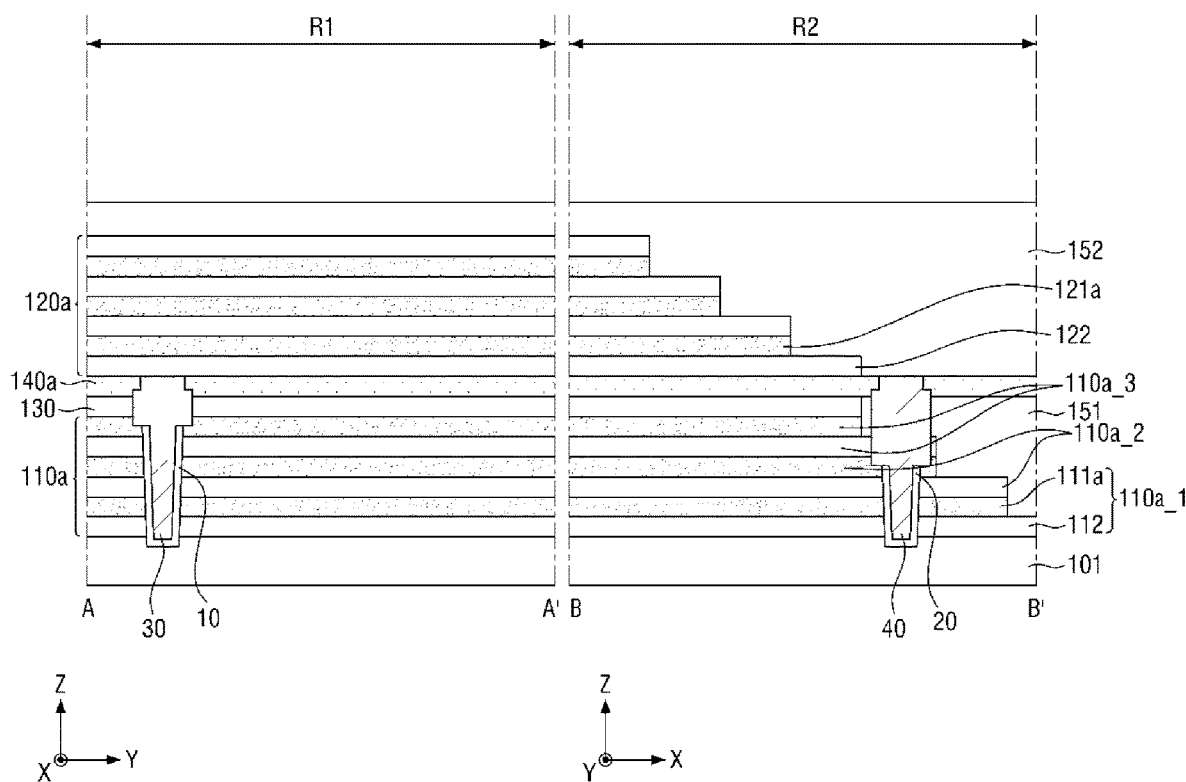
FIG. 12 is another view illustrating intermediate stages of fabrication, and is provided to explain a method for fabricating a semiconductor device according to some exemplary embodiments.

Referring to FIG. 12, a second pre stack structure 120a may be formed on the pre dummy gate layer 140a of each of the first region R1 and the second region R2. The second pre stack structure 120a may have a stair shape.

The second pre stack structure 120a may include the second insulating layer 122 and a second pre gate layer 121a which are alternately stacked with each other. The second pre gate layer 121a may include silicon nitride SiN, for example.

Figure 13:
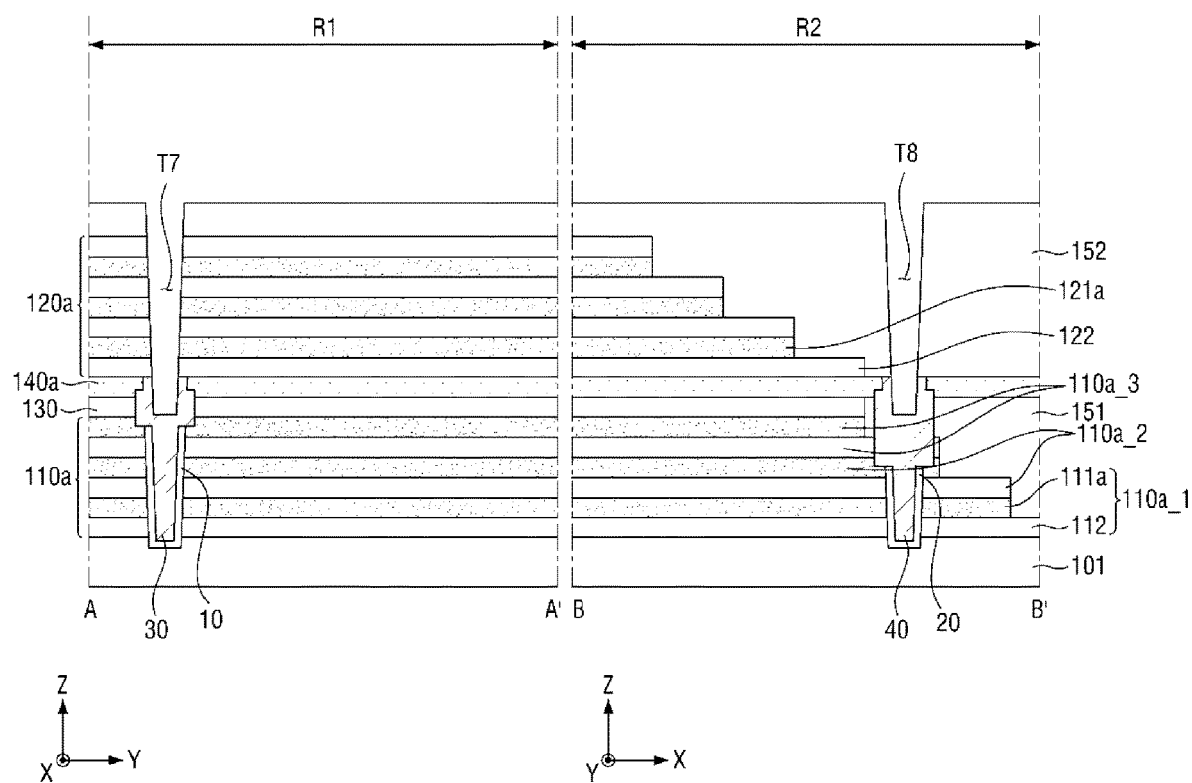
FIG. 13 is another view illustrating intermediate stages of fabrication, and is provided to explain a method for fabricating a semiconductor device according to some exemplary embodiments.

Referring to FIG. 13, a seventh trench T7, which penetrates through the second interlayer insulating layer 152, the second pre stack structure 120a and a portion of the first sacrificial layer 30, may be formed. Further, an eighth trench T8, which penetrates through a portion of the second interlayer insulating layer 152 and the second sacrificial layer 40, may be formed.

Figure 14:
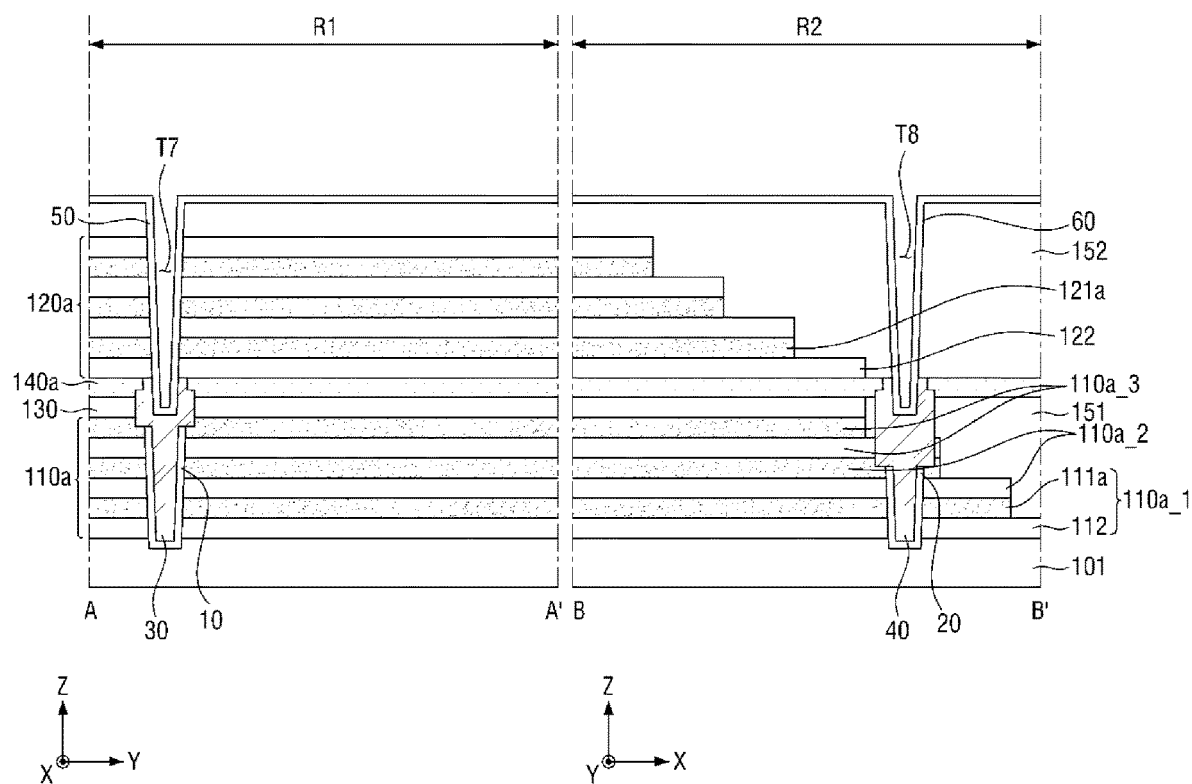
FIG. 14 is another view illustrating intermediate stages of fabrication, and is provided to explain a method for fabricating a semiconductor device according to some exemplary embodiments.

Referring to FIG. 14, a third protective layer 50 may be formed along an upper surface of the second interlayer insulating layer 152 of the first region R1, and a sidewall and a bottom surface of the seventh trench T7. Further, a fourth protective layer 60 may be formed along an upper surface of the second interlayer insulating layer of the second region R2, and a sidewall and a bottom surface of the eighth trench T8.

Figure 15:
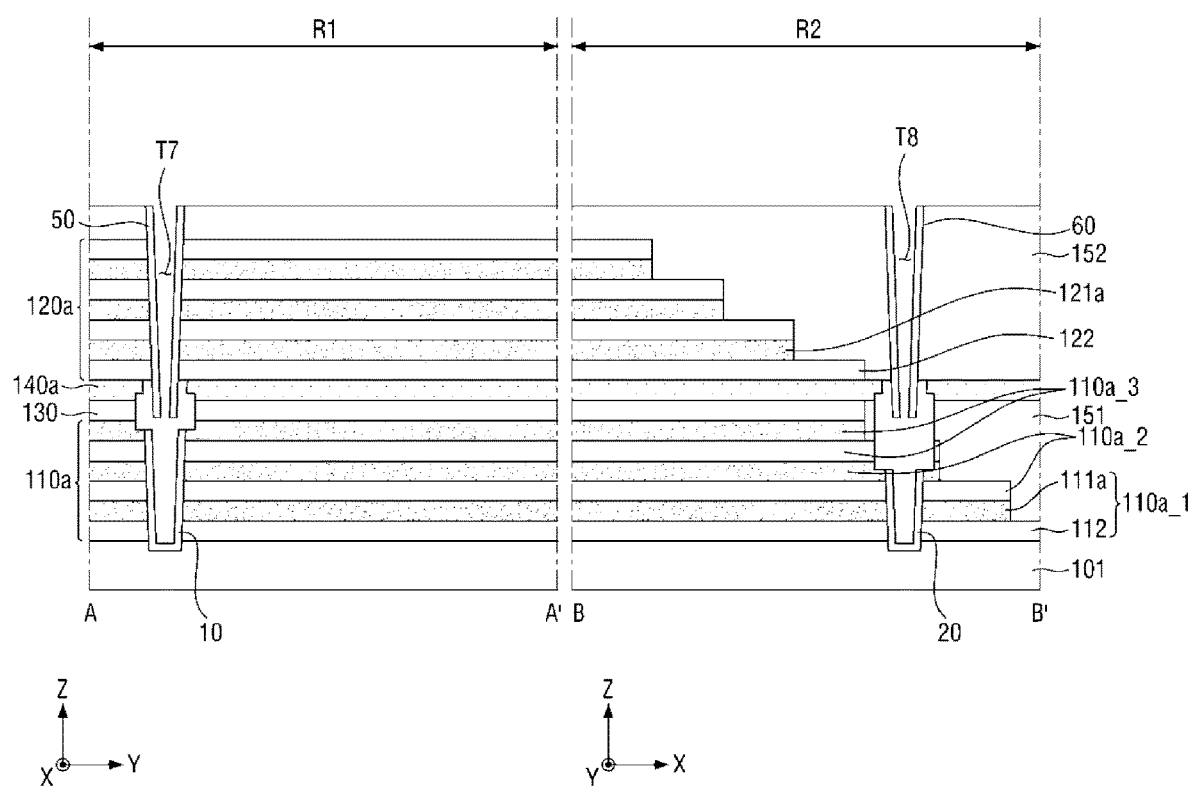
FIG. 15 is another view illustrating intermediate stages of fabrication, and is provided to explain a method for fabricating a semiconductor device according to some exemplary embodiments.

Referring to FIG. 15, the third protective layer formed on an upper surface of the second interlayer insulating layer 152 of the first region R1 and a bottom surface of the seventh trench T7 may be removed. Further, the third protective layer formed on an upper surface of the second interlayer insulating layer 152 of the second region R2 and a bottom surface of the eighth trench T8.

Next, the first sacrificial layer 30 may be removed through the seventh trench T7, and the second sacrificial layer 40 may be removed through the eighth trench T8.

Figure 16:
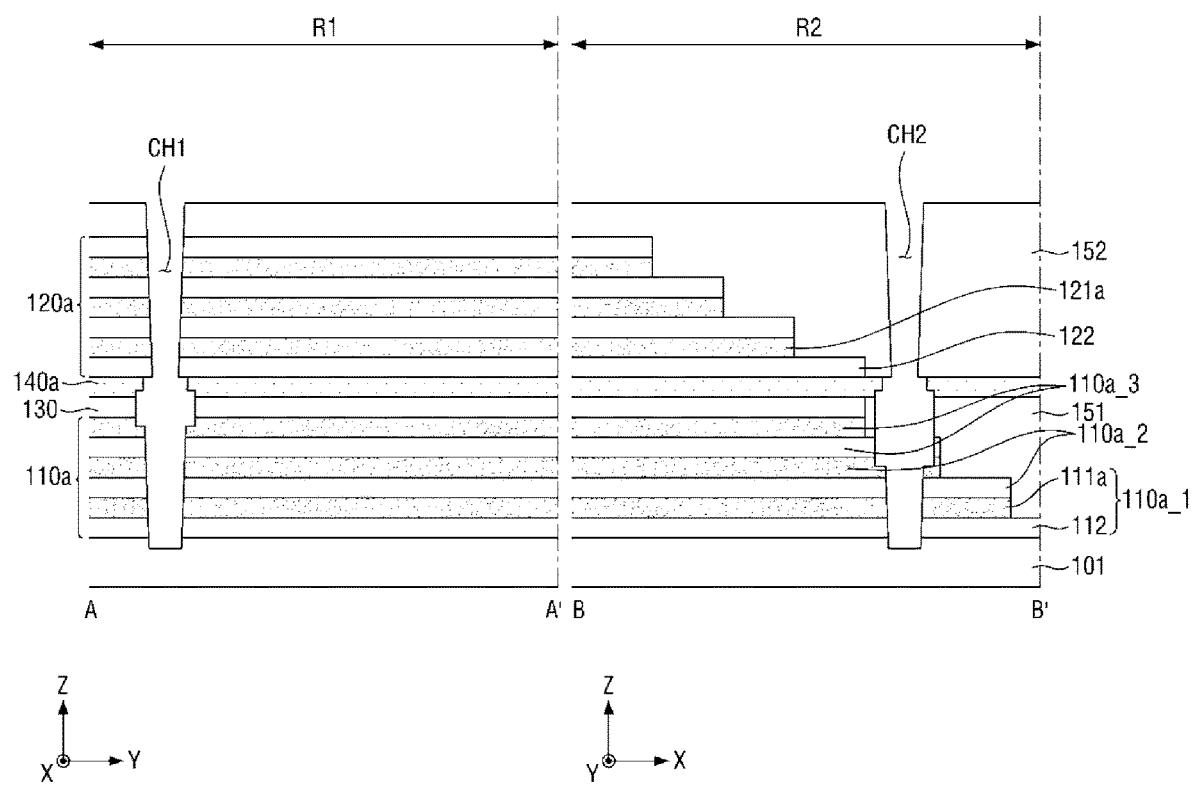
FIG. 16 is another view illustrating intermediate stages of fabrication, and is provided to explain a method for fabricating a semiconductor device according to some exemplary embodiments.

Referring to FIG. 16, the first channel hole CH1 may be formed as the first protective layer 10 and the third protective layer 50 formed within the seventh trench T7 are removed. Further, the second channel hole CH2 may be formed as the second protective layer 20 and the fourth protective layer 60 formed within the eighth trench T8 are removed.

Figure 17:
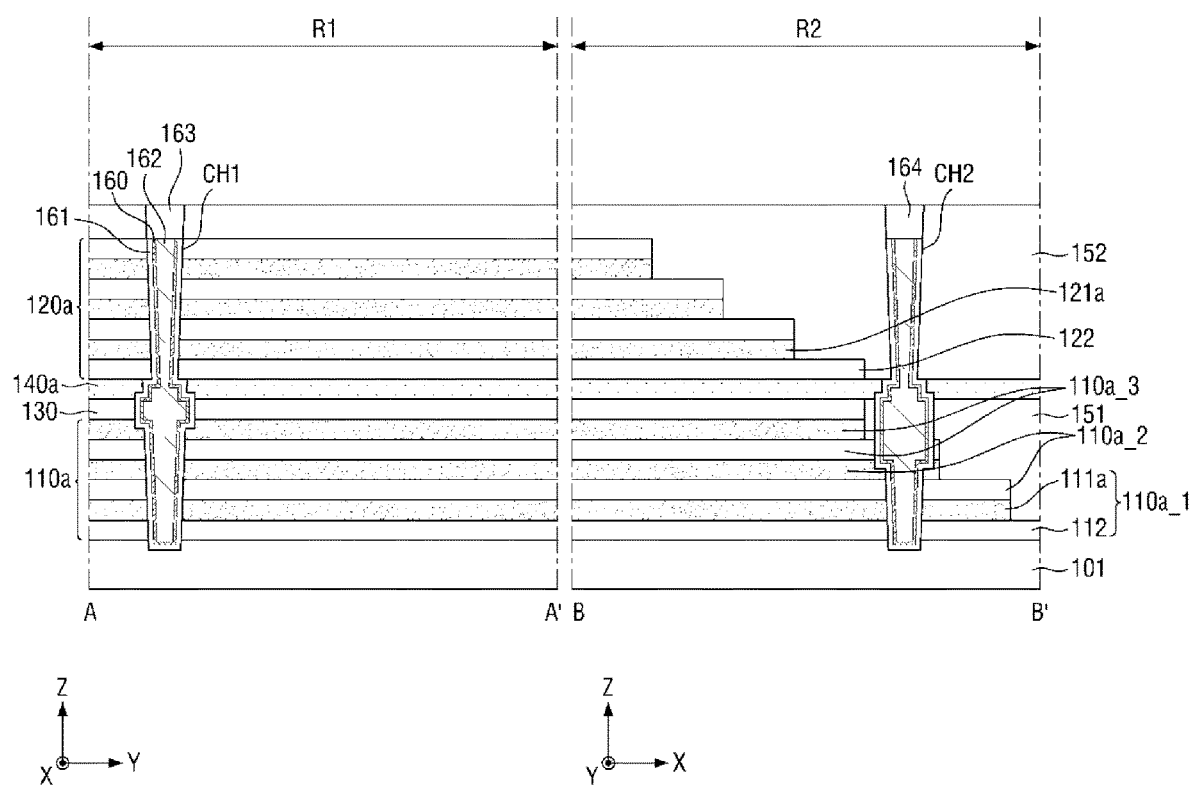
FIG. 17 is another view illustrating intermediate stages of fabrication, and is provided to explain a method for fabricating a semiconductor device according to some exemplary embodiments.

Referring to FIG. 17, the channel insulating layer 161 may be formed along a sidewall and a bottom surface of the first channel hole CH1 and a sidewall and a bottom surface of the second channel hole CH2.

Next, the channel layer 160 may be formed within each of the first channel hole CH1 and the second channel hole CH2 along the channel insulating layer 161.

Next, the channel filling insulating layer 162 may be formed on the channel layer 160 so as to fill each of the first channel hole CH1 and the second channel hole CH2. In this case, the channel layer 160, the channel insulating layer 161 and the channel filling insulating layer 162 may not be formed on each of a portion of an upper portion of the first channel hole CH1 and a portion of an upper portion of the second channel hole CH2.

Next, the first conductive pad 163 may be formed within the first channel hole CH1 in which the channel layer 160, the channel insulating layer 161 and the channel filling insulating layer 162 are not formed. Further, the second conductive pad 164 may be formed within the second channel hole CH2 in which the channel layer 160, the channel insulating layer 161 and the channel filling insulating layer 162 are not formed. Each of an upper surface of the first conductive pad 163 and an upper surface of the second conductive pad 164 may be formed on a same plane as an upper surface of the second interlayer insulating layer 152.

Figure 18:
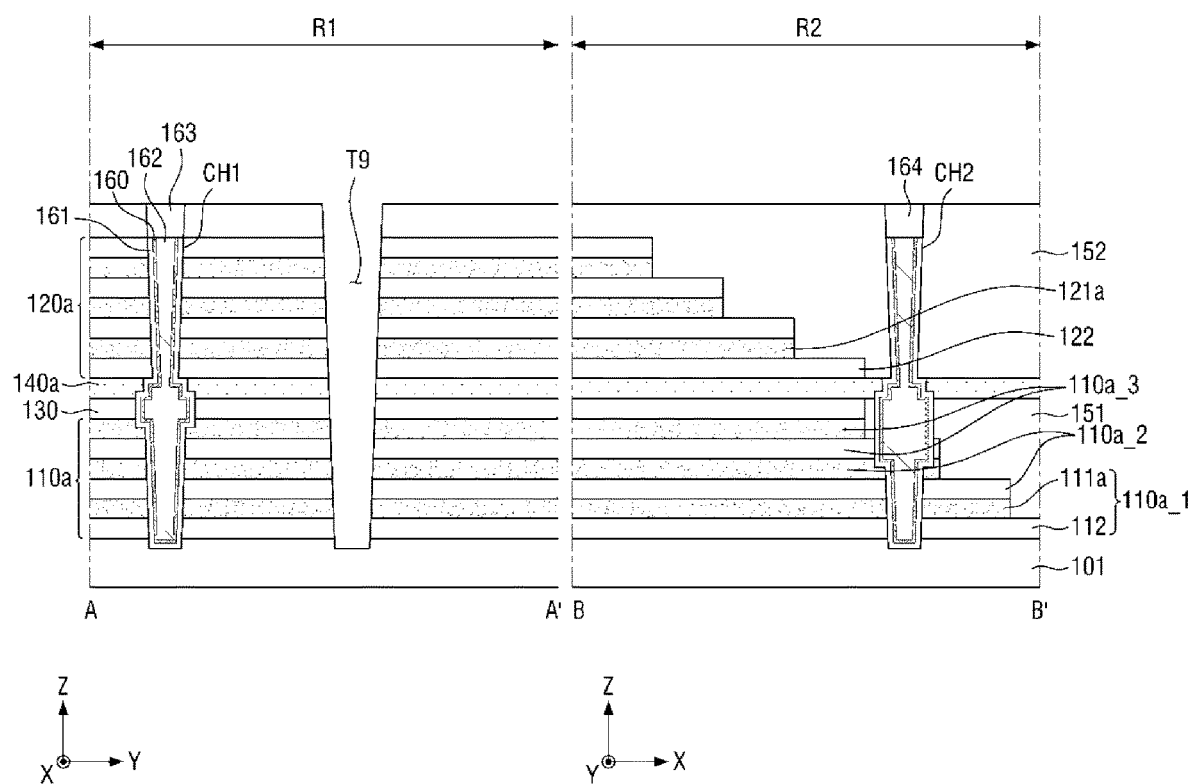
FIG. 18 is another view illustrating intermediate stages of fabrication, and is provided to explain a method for fabricating a semiconductor device according to some exemplary embodiments.

Referring to FIG. 18, a ninth trench T9, which penetrated through the first pre stack structure 110a, the junction layer 130, the pre dummy gate layer 140a, the second pre stack structure 120a and the second interlayer insulating layer 152 in the second direction Z on the first substrate 101 of the first region R1, may be formed.

The ninth trench T9 may be displaced from the first channel hole CH1. The ninth trench T9 may extend within the first substrate 101.

Figure 19:
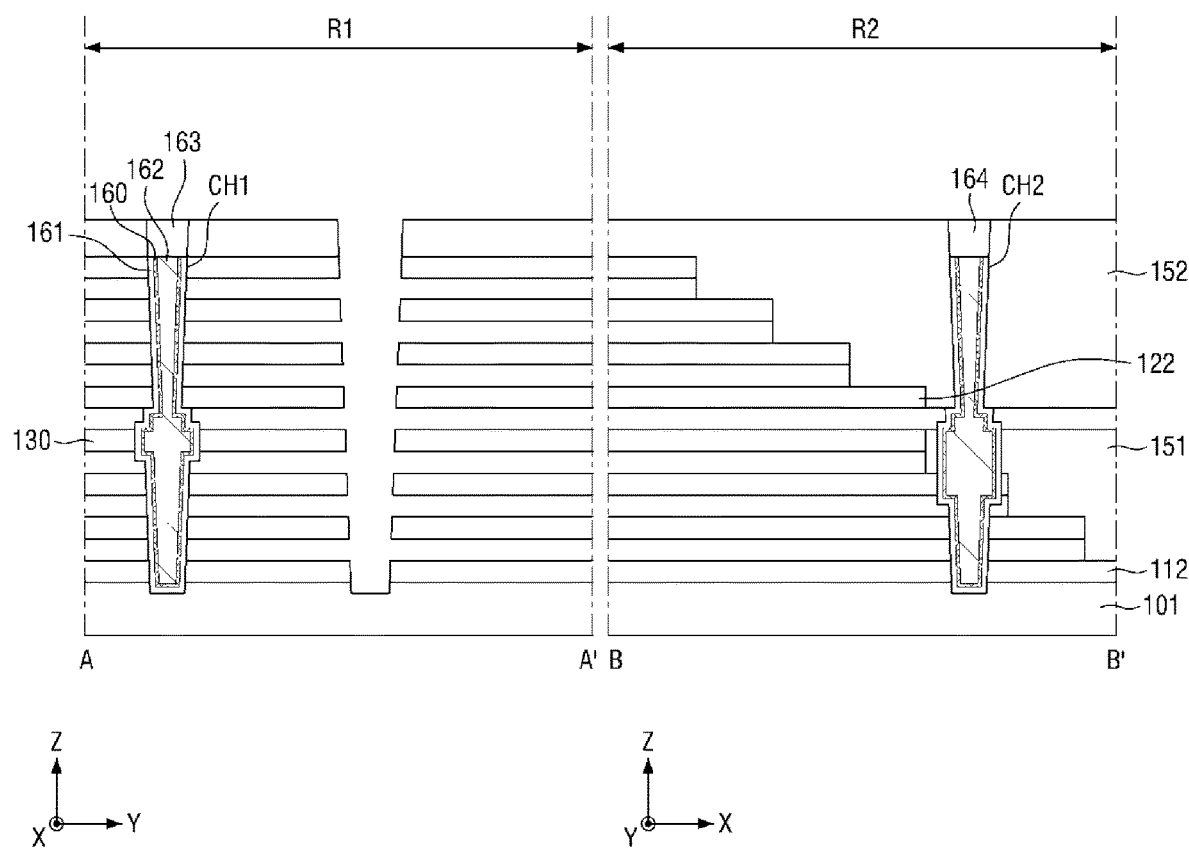
FIG. 19 is another view illustrating intermediate stages of fabrication, and is provided to explain a method for fabricating a semiconductor device according to some exemplary embodiments.

Referring to FIG. 19, the first pre gate layer 111a, the second pre gate layer 121a and the pre dummy gate layer 140a may be removed by performing the wet etch process through the ninth trench T9.

Figure 20:
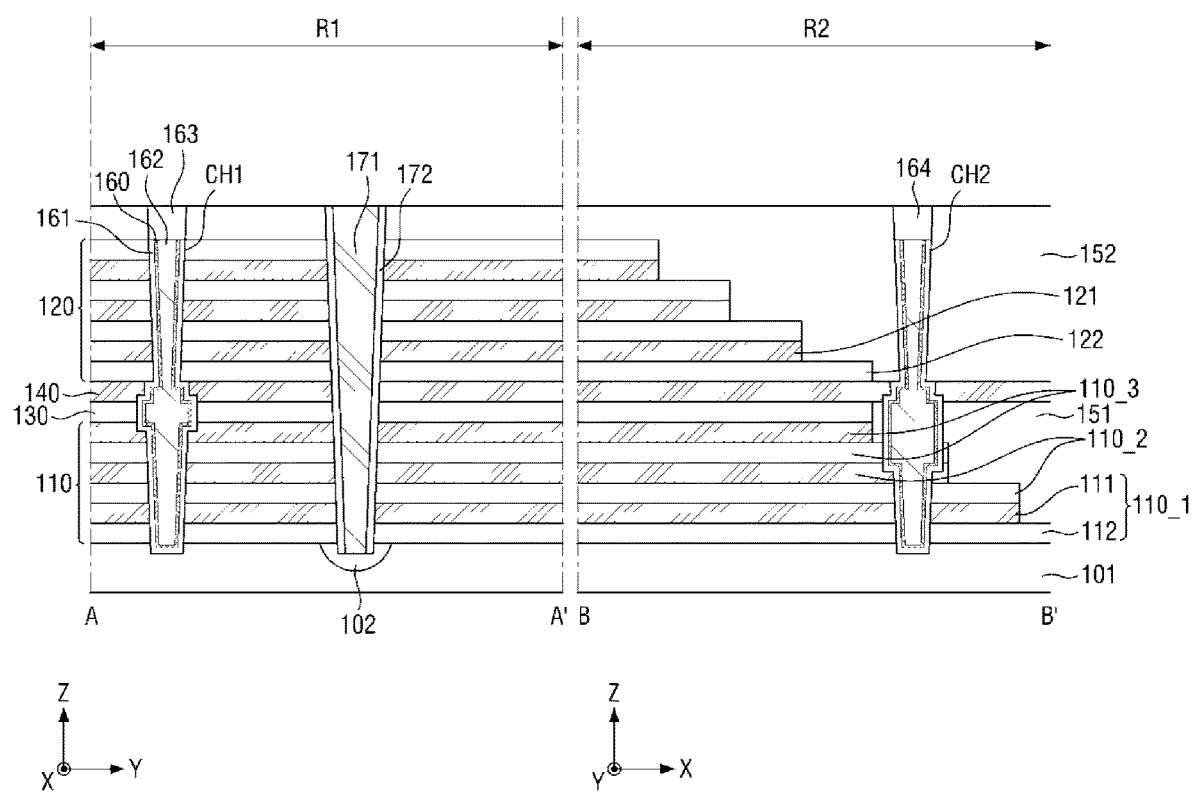
FIG. 20 is another view illustrating intermediate stages of fabrication, and is provided to explain a method for fabricating a semiconductor device according to some exemplary embodiments.

Referring to FIG. 20, one of the first gate electrodes 111 may be formed on a region where the first pre gate layer 111a is removed, one of the second gate electrodes 121 may be formed on a region where the second pre gate layer 121a is removed, and the dummy gate electrode 140 may be formed on a region where the pre dummy gate layer 140a is removed.

One of the first gate electrodes 111, one of the second gate electrodes 121 and the dummy gate electrode 140 may be formed through a same process.

Next, an impurity region 102 may be formed within the first substrate 101 through the impurity casting process.

Next, the line insulating layer 172 may be formed along a sidewall of the ninth trench T9 of FIG. 18. Next, the conductive line 171 may be formed on the line insulating layer 172 so as to fill an inner portion of the ninth trench T9 of FIG. 18.

Referring to FIG. 2, the bit line contact 181 and the bit line 180 may be sequentially formed on the first conductive pad 163 formed on the first channel hole CH1.

Through the above-described processes, the semiconductor device illustrated in FIG. 2 may be fabricated.

Hereinbelow, a semiconductor device according to some other exemplary embodiments will be described with reference to FIG. 21. The difference from the semiconductor device illustrated in FIG. 2 will be highlighted.

Figure 21:
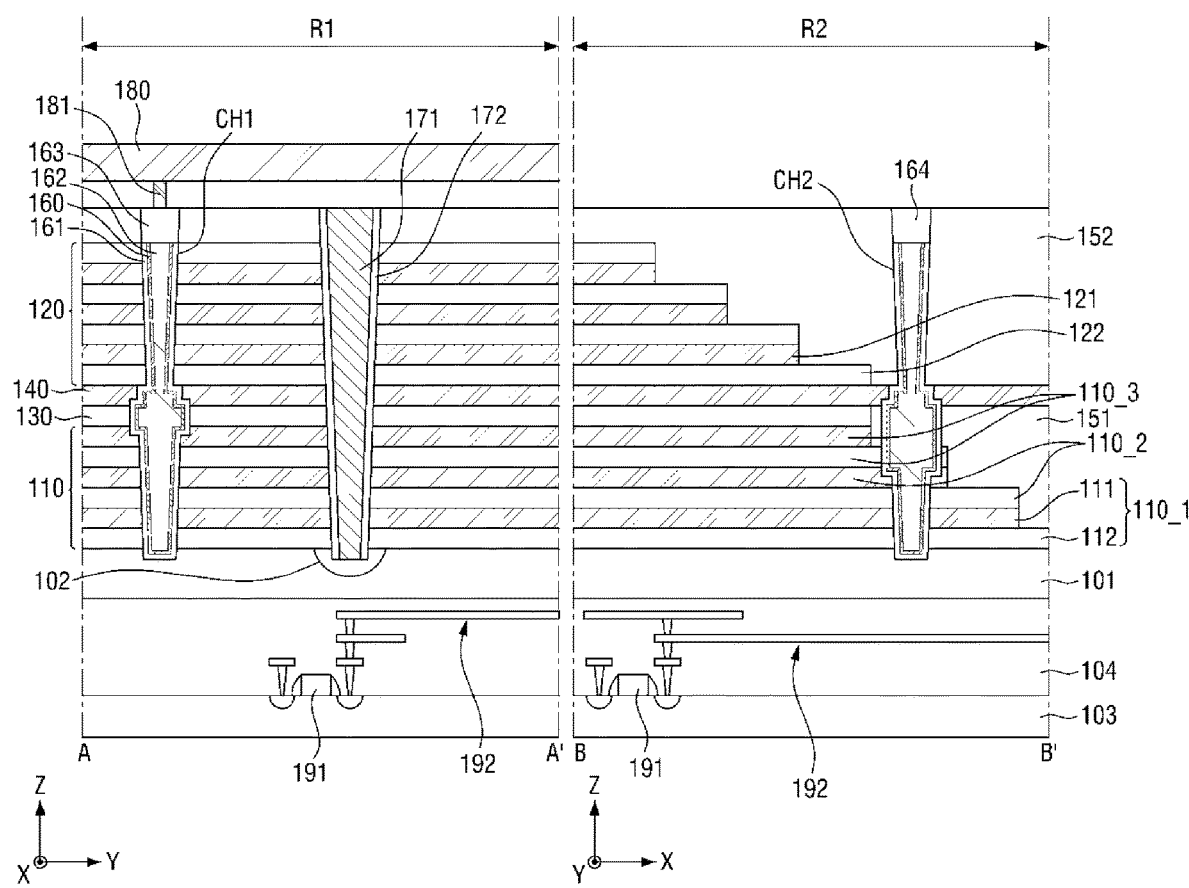
FIG. 21 is a cross-sectional view provided to explain a semiconductor device according to some other exemplary embodiments.

FIG. 21 is a cross-sectional view provided to explain a semiconductor device according to some other exemplary embodiments.

Referring to FIG. 21, in the semiconductor device according to some other exemplary embodiments, a peripheral circuit region PR of FIG. 1 may be disposed on a lower portion of the first substrate 101. That is, the cell region CR and the peripheral circuit region PR of FIG. 1 may be overlapped with each other in the second direction Z.

The peripheral circuit region PR of FIG. 1 may include a second substrate 103, a peripheral transistor 191 disposed on the second substrate 103, and a lower connection wire 192 connected with the peripheral transistor 191.

Further, the peripheral circuit region PR of FIG. 1 may include an upper surface of the second substrate 103, the peripheral transistor 191, and a third interlayer insulating layer 104 covering the lower connection wire 192.

Hereinbelow, a semiconductor device according to some other exemplary embodiments will be described with reference to FIGS. 22 and 23. The difference from the semiconductor device and the method for fabricating the semiconductor device illustrated in FIGS. 2 to 20 will be highlighted.

Figure 22:
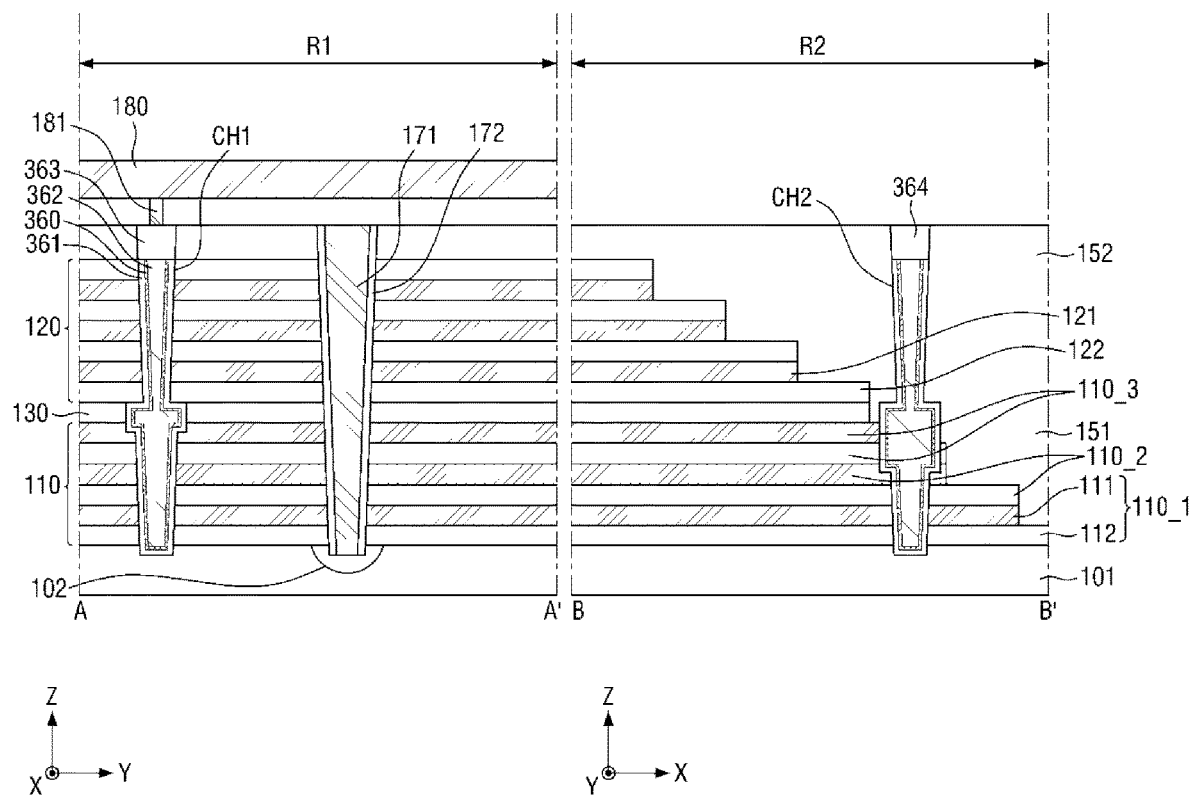
FIG. 22 is a cross-sectional view provided to explain a semiconductor device according to some other exemplary embodiments.

FIG. 22 is a cross-sectional view provided to explain a semiconductor device according to some other exemplary embodiments. FIG. 23 is a view illustrating intermediate stages of fabrication, provided to explain a method for fabricating a semiconductor device according to some other exemplary embodiments.

Referring to FIG. 22, the semiconductor device according to some other exemplary embodiments may be disposed so as to be in contact with the second stack structure 120 and the junction layer 130. Specifically, a lower surface of the second insulating layer 122 disposed on a lowermost portion of the second stack structure 120 may be in contact with an upper surface of the junction layer 130.

The channel insulating layer 361, the channel layer 360, the channel filling insulating layer 362, and the first conductive pad 363 may be sequentially formed on an inner portion of the first channel hole CH3. Further, the channel insulating layer 361, the channel layer 360, the channel filling insulating layer 362 and the second conductive pad 364 may be sequentially formed on an inner portion of the second channel hole CH4.

Figure 23:
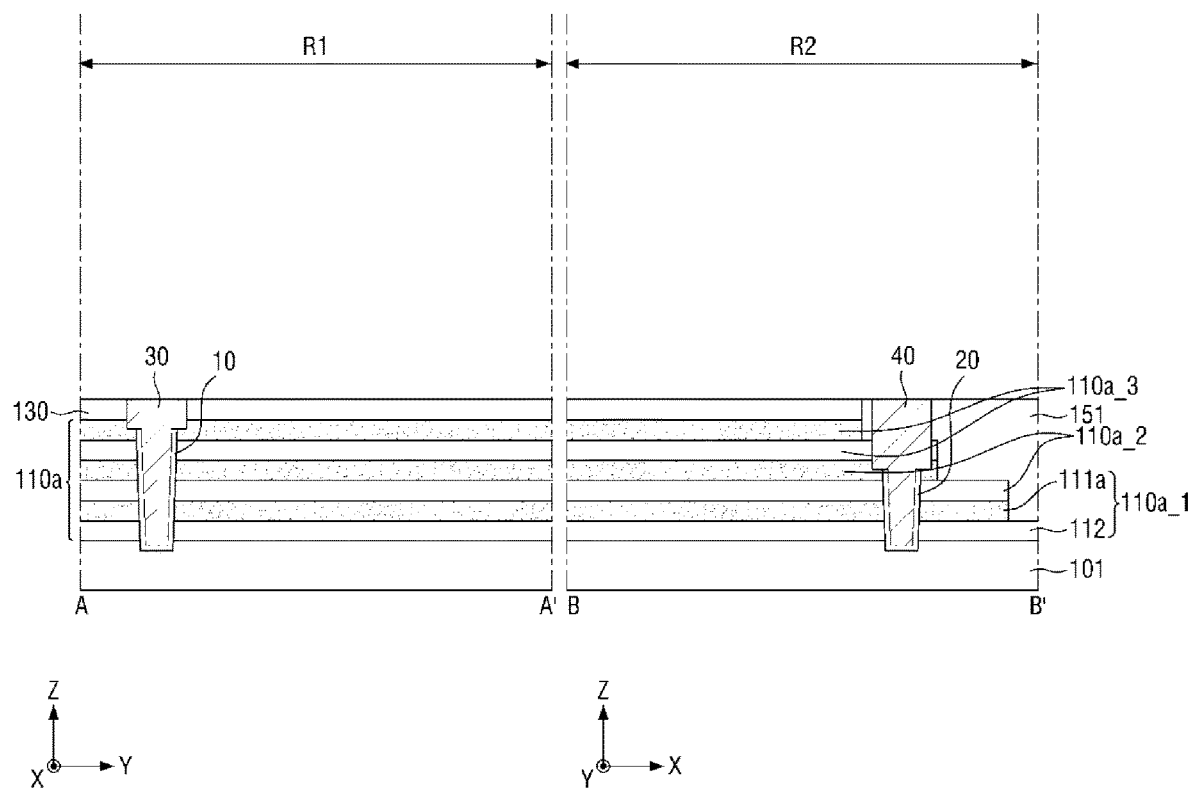
FIG. 23 is a view illustrating intermediate stages of fabrication, provided to explain a method for fabricating a semiconductor device according to some other exemplary embodiments.

Referring to FIG. 23, a method for fabricating a semiconductor device according to some other exemplary embodiments may remove the pre dummy gate layer 140a, and the first sacrificial layer 30 and the second sacrificial layer 40 formed within the pre dummy gate layer 140a through the planarization process after the fabricating method illustrated in FIGS. 5 to 11 is performed.

Next, the semiconductor device illustrated in FIG. 22 may be fabricated after the process illustrated in FIGS. 12 to 20 is performed.

Hereinbelow, a semiconductor device according to some other exemplary embodiments will be described with reference to FIG. 24. The difference from the semiconductor device illustrated in FIG. 22 will be highlighted.

Figure 24:
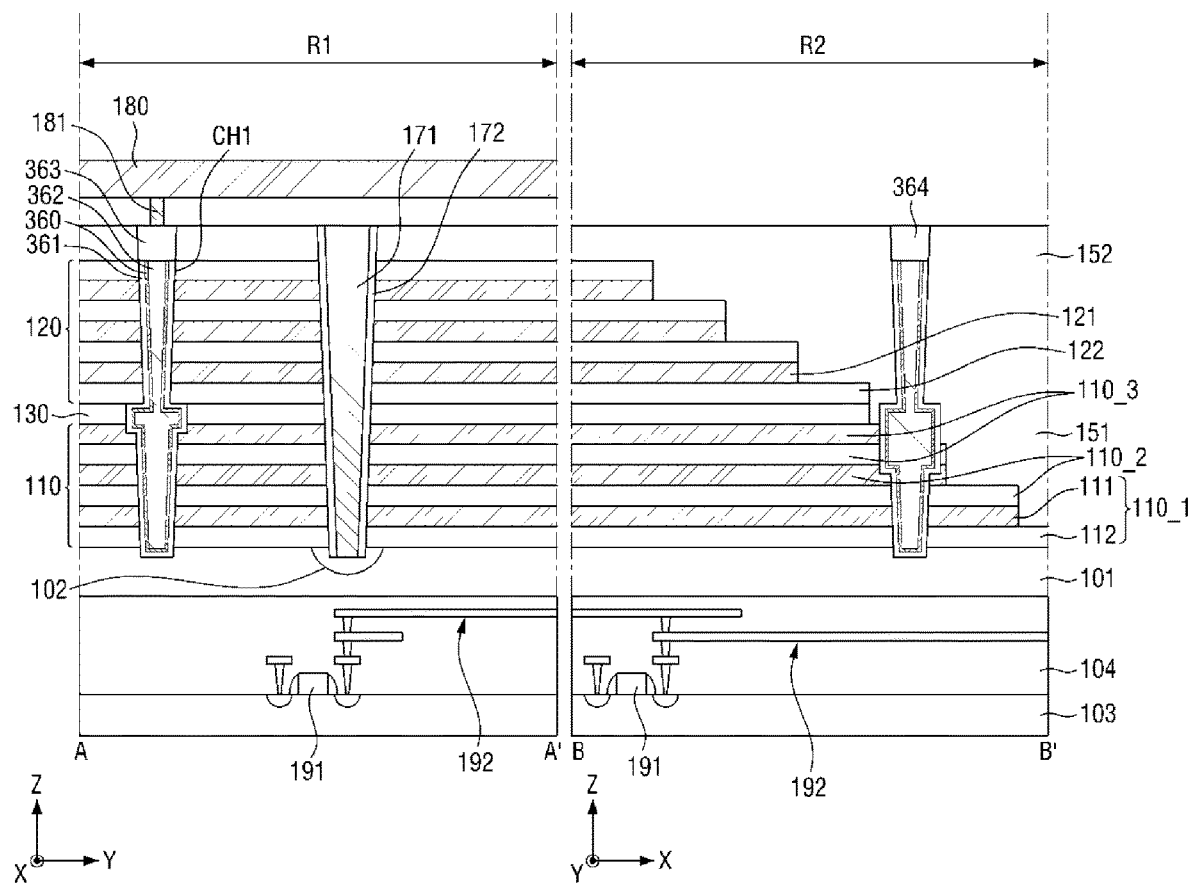
FIG. 24 is a cross-sectional view provided to explain a semiconductor device according to some other exemplary embodiments.

FIG. 24 is a cross-sectional view provided to explain a semiconductor device according to some other exemplary embodiments.

Referring to FIG. 24, in the semiconductor device according to some other exemplary embodiments, the peripheral circuit region PR of FIG. 1 may be disposed on a lower portion of the first substrate 101. That is, the cell region CR and the peripheral circuit region PR of FIG. 1 may be overlapped with each other in the second direction Z.

The peripheral circuit region PR of FIG. 1 may include a second substrate 103, a peripheral transistor 191 disposed on the second substrate 103, and a lower connection wire 192 connected with the peripheral transistor 191.

Further, the peripheral circuit region PR of FIG. 1 may include an upper surface of the second substrate 103, the peripheral transistor 191, and a third interlayer insulating layer 104 covering the lower connection wire 192.

Exemplary embodiments according to the present disclosure were explained hereinabove with reference to the drawings attached, but it should be understood that the present disclosure is not limited to the aforementioned exemplary embodiments, but may be fabricated in various different forms, and may be implemented by a person skilled in the art in other specific forms without altering the technical concept or essential characteristics of the present disclosure. Accordingly, it will be understood that the exemplary embodiments described above are only illustrative and should not be construed as limiting.

What is claimed is:

1. A semiconductor device, comprising:
a first substrate in which a first region and a second region are defined;
a first stack structure comprising a plurality of first gate electrodes which are displaced and stacked sequentially on the first substrate, lengths of the plurality of first gate electrodes in a first direction decrease in proportion to distance of the first gate electrodes away from the first substrate of the second region;
a second stack structure comprising a plurality of second gate electrodes which are displaced and stacked sequentially on the first stack structure;
a junction layer disposed between the first stack structure and the second stack structure;
a first interlayer insulating layer disposed on a side surface of the first stack structure;
a second interlayer insulating layer covering the second stack structure;
a first channel hole comprising a first portion penetrating through the first stack structure, a second portion penetrating through the junction layer and a third portion penetrating through the second stack structure on the first substrate of the first region; and
a second channel hole comprising a first portion penetrating through the first stack structure, a second portion penetrating through the first interlayer insulating layer and a third portion penetrating through the second interlayer insulating layer on the first substrate of the second region,
wherein a height of the second portion of the first channel hole in a second direction orthogonal to the first direction is less than a height of the second portion of the second channel hole in the second direction.

2. The semiconductor device of claim 1, further comprising a dummy gate electrode disposed between the junction layer and the second stack structure.

3. The semiconductor device of claim 2, wherein the dummy gate electrode is protruded farther in the first direction compared to each of the plurality of first gate electrodes.

4. The semiconductor device of claim 2, wherein the dummy gate electrode comprises the same material as that of each of the plurality of first gate electrodes.

5. The semiconductor device of claim 1, wherein a width of the second portion of the first channel hole is more than a width of the third portion of the first channel hole.

6. The semiconductor device of claim 1, wherein a width of the second portion of the second channel hole is more than a width of the third portion of the second channel hole.

7. The semiconductor device of claim 1, wherein the junction layer comprises the same material as that of the first interlayer insulating layer.

8. The semiconductor device of claim 1, wherein the junction layer is in contact with the second stack structure.

9. The semiconductor device of claim 1, further comprising a second substrate disposed on a lower portion of the first substrate and comprising a peripheral transistor and a lower connection wire electrically connected with the peripheral transistor.

10. The semiconductor device of claim 1, further comprising a conductive line displaced from the first channel hole on the first substrate of the first region and penetrating through the first stack structure, the junction layer and the second stack structure.

11. A semiconductor device, comprising:
a first substrate in which a first region and a second region are defined;
a first stack structure comprising a plurality of first gate electrodes which are displaced and stacked sequentially on the first substrate, lengths of the plurality of first gate electrodes in a first direction decrease in proportion to distance of the first gate electrodes away from the first substrate of the second region;
a dummy gate electrode disposed on the first stack structure;
a second stack structure comprising a plurality of second gate electrodes which are displaced and stacked sequentially on the dummy gate electrode;
a junction layer disposed between the first stack structure and the dummy gate electrode;
a first interlayer insulating layer disposed on a side surface of the first stack structure;
a second interlayer insulating layer covering the second stack structure and the dummy gate electrode;
a first channel hole penetrating through the first stack structure, the junction layer, the dummy gate electrode and the second stack structure on the first substrate of the first region, the first channel hole comprising a first portion penetrating through the first stack structure and a second portion penetrating through the junction layer; and
a second channel hole penetrating through the first stack structure, the first interlayer insulating layer, the dummy gate electrode, and the second interlayer insulating layer on the first substrate of the second region, the second channel hole comprising a first portion penetrating through the first stack structure and a second portion penetrating through the first interlayer insulating layer,
wherein a height of the second portion of the first channel hole in a second direction orthogonal to the first direction is less than a height of the second channel hole in the second direction.

12. The semiconductor device of claim 11, further comprising:
a first conductive pad disposed within the first channel hole;
a second conductive pad disposed within the second channel hole; and
a bit line disposed on the first conductive pad, electrically connected with the first conductive pad, and electrically insulated from the second conductive pad.

13. The semiconductor device of claim 11, wherein the second channel hole is not in contact with the second stack structure.

14. The semiconductor device of claim 11, further comprising a second substrate disposed on a lower portion of the first substrate and comprising a peripheral transistor and a lower connection wire electrically connected with the peripheral transistor.

15. A semiconductor device, comprising:
a substrate in which a first region and a second region are defined;
a first stack structure comprising a plurality of first gate electrodes which are displaced and stacked sequentially on the substrate;
a second stack structure comprising a plurality of second gate electrodes which are displaced and stacked sequentially on the first stack structure;
a junction layer disposed between the first stack structure and the second stack structure;
a first interlayer insulating layer disposed on a side surface of the first stack structure;
a second interlayer insulating layer covering the second stack structure;
a first channel hole comprising a first portion penetrating through the first stack structure, a second portion penetrating through the junction layer and a third portion penetrating through the second stack structure on the substrate of the first region; and
a second channel hole comprising a first portion penetrating through the first stack structure, a second portion penetrating through the first interlayer insulating layer and a third portion penetrating through the second interlayer insulating layer on the substrate of the second region,
wherein the second channel hole is not in contact with the second stack structure, and
a width of the second portion of the first channel hole is more than a width of the third portion of the first channel hole.

16. The semiconductor device of claim 15, wherein lengths of the plurality of first gate electrodes in a first direction decrease in proportion to distances of the first gate electrodes away from the substrate of the second region.

17. The semiconductor device of claim 16, wherein a height of the second portion of the first channel hole in a second direction orthogonal to the first direction is less than a height of the second channel hole in the second direction.

18. The semiconductor device of claim 15, further comprising a dummy gate electrode disposed between the junction layer and the second stack structure.

19. The semiconductor device of claim 15, wherein a width of the second portion of the second channel hole is more than a width of the third portion of the second channel hole.

* * * * *